(12) United States Patent
Shiobara et al.

(10) Patent No.: US 7,368,209 B2
(45) Date of Patent: May 6, 2008

(54) METHOD FOR EVALUATING SENSITIVITY OF PHOTORESIST, METHOD FOR PREPARATION OF PHOTORESIST AND MANUFACTURING METHOD OF SEMICONDUCTOR DEVICE

(75) Inventors: Eishi Shiobara, Yokohama (JP); Kei Hayasaki, Kamakura (JP); Tadahito Fujisawa, Tokyo (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 770 days.

(21) Appl. No.: 10/855,380

(22) Filed: May 28, 2004

(65) Prior Publication Data
US 2004/0265713 A1 Dec. 30, 2004

(30) Foreign Application Priority Data
May 30, 2003 (JP) .......................... P2003-155262

(51) Int. Cl.
*G03C 5/00* (2006.01)
*G03F 9/00* (2006.01)

(52) U.S. Cl. ........................................ 430/30; 430/311

(58) Field of Classification Search ................. 430/30, 430/311
See application file for complete search history.

(56) References Cited

U.S. PATENT DOCUMENTS

| 6,226,074 B1 | 5/2001 | Fujisawa et al. ............... 355/53 |
| 6,376,139 B1 | 4/2002 | Fujisawa et al. ............... 430/30 |
| 6,407,399 B1 * | 6/2002 | Livesay ................... 250/492.3 |
| 6,667,139 B2 | 12/2003 | Fujisawa et al. ............... 430/30 |

FOREIGN PATENT DOCUMENTS

JP 2001-102282 4/2001

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

An method for evaluating sensitivity of a photoresist includes transferring an exposure dose monitor mark onto an inspection resist film with an inspection setting exposure dose using an exposure tool. Inspection sensitivity index varying according to the inspection setting exposure dose is measured, using an inspection transferred image of the exposure dose monitor mark delineated on the inspection resist film. An inspection photoresist sensitivity of the inspection resist film is calculated using sensitivity calibration data, based on the inspection sensitivity index.

28 Claims, 15 Drawing Sheets

METHOD FOR EVALUATING SENSITIVITY OF PHOTORESIST, METHOD FOR PREPARATION OF PHOTORESIST AND MANUFACTURING METHOD OF SEMICONDUCTOR DEVICE

CROSS REFERENCE TO RELATED APPLICATIONS

This application is based upon and claims the benefit of priority from prior Japanese Patent Application P2003-155262 filed on May 30, 2003; the entire contents of which are incorporated by reference herein.

BACKGROUND OF THE INVENTION

1. Field of the Invention

The present invention relates to a method for evaluating sensitivity of a photoresist used in a photolithography process for manufacturing a semiconductor device, a method for preparation of a photoresist and a manufacturing method of a semiconductor device.

2. Description of the Related Art

In a photolithography process for manufacturing semiconductor device such as a semiconductor integrated circuit, a circuit pattern delineated on a photomask is transferred onto a resist film coated on a semiconductor substrate by an exposure tool. In accordance with recent higher integration and higher performance of a semiconductor device, it is required to transfer a finer circuit pattern delineated on a photomask to a semiconductor substrate. The imaging performance of a reduction projection exposure tool can be evaluated using an optical imaging theory derived from the Rayleigh equation. A resolution R of an exposure tool is proportional to a wavelength $\lambda$ of the exposure light and inversely proportional to a numerical aperture NA. Furthermore, a depth of focus DOF is proportional to the exposure wavelength $\lambda$ and inversely proportional to the square of the numerical aperture NA. Accordingly, in response to requirements for miniaturization of a semiconductor device, improvements in the process have been achieved, including shortening of the exposure wavelength $\lambda$ and achieving a higher NA of a projection lens. However, along with the recent demands for further miniaturization of the semiconductor device, it has become extremely difficult to ensure an exposure latitude and a depth of focus DOF. Thus, the miniaturization of a semiconductor device significantly reduces the manufacturing yield.

To implement a photolithography process with a small process margin, great importance has been attached to a precise analysis of errors that decrease the process margin and error allocation (error budget). For example, even when many chips on a semiconductor substrate have been exposed with the same prescribed exposure dose, the effective appropriate exposure dose varies due to avariation in photoresist sensitivity, post exposure bake (PEB), nonuniformity of development in a substrate, a variation in thickness of a resist film on a substrate, and the like. Consequently, a decrease in manufacturing yield occurs. To efficiently apply the small process margin and to prevent a decrease in the manufacturing yield, a method for implementing feedback or feed forward control by highly accurate monitoring an exposure dose and focusing is needed. At the same time, it is also necessary to perform a precise analysis on error factors which decrease the process margin for each process unit and to correct the major error factors based on results of the analysis.

For controlling an exposure dose and focusing in a reduction projection exposure tool, an exposure dose monitoring method and a focus monitoring method have been proposed (refer to Japanese Patent Laid-Open No. 2001-102282). In the proposed exposure dose monitoring method, an image is transferred with a stepped exposure distribution by using a photomask having a pattern therein with a dimensional ratio (a duty ratio) of a transparent portion and an opaque portion that is continuously changed in one direction by a pitch that can not resolve images on the semiconductor substrate. In the proposed focus monitoring method, focus is monitored using a focus monitor mark having diamond-shaped patterns that shift each phase of the exposure light so as to show different characteristics of pattern dimensions for defocus.

In addition, as a sensitivity control method for a photoresist, the sensitivity is evaluated by measuring a dimension of a delineated pattern on a resist film, which is transferred by a prescribed mask pattern using an exposure tool. Another sensitivity control method for a photoresist has been provided, where the sensitivity is evaluated by determining a clearing dose by a pattern sufficiently larger than a minimum feature size corresponding to a resolution of an exposure tool. Here, the "clearing dose" refers to the lowest exposure dose for which all of the resist film is removed.

As described above, in microfabrication it is important to control exposure conditions for photolithography highly accurately in order to achieve processing accuracy and uniformity in pattern dimensions of semiconductor devices. Particularly, an evaluation method for photoresist sensitivity becomes more important for a fine pattern with smaller exposure latitude and smaller focus margin, or for an isolated fine pattern. However, in the evaluation method for photoresist sensitivity by measuring a dimension of a delineated pattern, the dimension may vary depending on not only the exposure dose but also focusing of an exposure tool. Therefore, using the method for measuring the dimension of the delineated pattern, it is difficult to determine variations in the photoresist sensitivity, separating from the focus variation. Furthermore, with regard to the evaluation method by determining the clearing dose, it is difficult to determine an accurate exposure dose corresponding to the remaining thickness of the resist film, since the remaining thickness changes abruptly in the vicinity of the clearing dose.

SUMMARY OF THE INVENTION

A first aspect of the present invention inheres in a method for evaluating sensitivity of a photoresist, including transferring an exposure dose monitor mark onto an inspection resist film with an inspection setting exposure dose using an exposure tool; measuring an inspection sensitivity index varying according to the inspection setting exposure dose, using an inspection transferred image of the exposure dose monitor mark delineated on the inspection resist film; and calculating an inspection photoresist sensitivity of the inspection resist film using sensitivity calibration data, based on the inspection sensitivity index.

A second aspect of the present invention inheres in a method for preparation of a photoresist, including transferring an exposure dose monitor mark onto a reference resist film with an reference setting exposure dose using an exposure tool; measuring a reference sensitivity index varying according to the reference setting exposure dose, using a reference transferred image of the exposure dose monitor mark delineated on the reference resist film; obtaining a relationship between the reference setting exposure dose and the reference sensitivity index as the sensitivity calibration data; transferring an exposure dose monitor mark onto an inspection resist film with an inspection setting exposure dose using the exposure tool, the inspection resist film coated by an inspection target photoresist; measuring an inspection sensitivity index varying according to the inspection setting exposure dose, using an inspection transferred image of the exposure dose monitor mark delineated on the inspection resist film; calculating an inspection photoresist sensitivity of the inspection resist film using sensitivity calibration data, based on the inspection sensitivity index; calculating a sensitivity difference between the inspection setting exposure dose and the inspection photoresist sensitivity; and modifying the inspection target photoresist based on the sensitivity difference.

A third aspect of the present invention inheres in a manufacturing method of a semiconductor device, including transferring an exposure dose monitor mark onto a reference resist film with an reference setting exposure dose using an exposure tool; measuring a reference sensitivity index varying according to the reference setting exposure dose, using a reference transferred image of the exposure dose monitor mark delineated on the reference resist film; obtaining a relationship between the reference setting exposure dose and the reference sensitivity index as the sensitivity calibration data; transferring an exposure dose monitor mark onto an inspection resist film with an inspection setting exposure dose using the exposure tool, the inspection resist film coated by an inspection target photoresist; measuring an inspection sensitivity index varying according to the inspection setting exposure dose, using an inspection transferred image of the exposure dose monitor mark delineated on the inspection resist film; calculating an inspection photoresist sensitivity of the inspection resist film using sensitivity calibration data, based on the inspection sensitivity index; calculating a sensitivity difference between the inspection setting exposure dose and the inspection photoresist sensitivity; modifying the inspection target photoresist based on the sensitivity difference to prepare a manufacturing photoresist; loading a semiconductor substrate coated with the manufacturing photoresist in the exposure tool; and transferring a circuit pattern of a photomask on the semiconductor substrate so as to manufacture a semiconductor device.

DETAILED DESCRIPTION OF THE INVENTION

Figure 1:
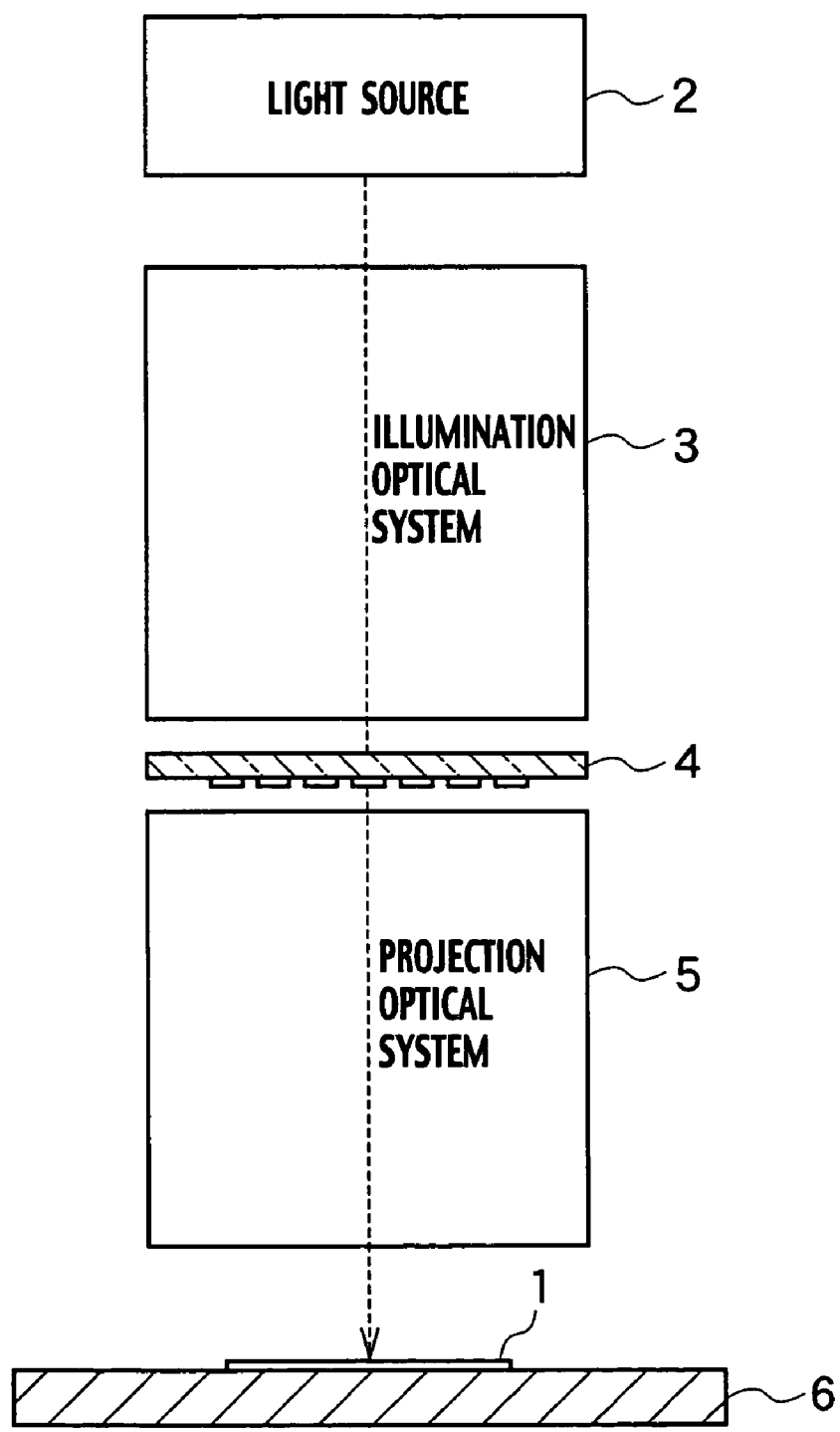
FIG. 1 is a schematic diagram of an exposure tool used in an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

An exposure tool used to explain an embodiment of the invention is, as shown in FIG. 1, a reduction projection exposure tool (stepper) with a reduction ratio of 1/4. A krypton fluoride (KrF) excimer laser with a wavelength λ of 248 nm is used as a light source 2. An illumination optical system 3 includes a fly's eye lens and a condenser lens. A coherence factor σ representing the interference characteristic of the illumination optical system 3 is 0.3. A projection optical system 5 includes a projection lens and an aperture stop. The numerical aperture NA of the projection lens is 0.6. By an exposure light, the pattern of a photomask 4 provided between the illumination optical system 3 and the projection optical system 5 is demagnified and projected onto a semiconductor substrate 1 provided on a stage 6. Note that although the reduction ratio of 1/4 is applied to the exposure tool for simplification of explanation, it is needless to say, any reduction ratio may be applied thereto. In the following description, unless otherwise noted, the pattern dimension on the photomask 4 will be described in terms of a dimension that is demagnified and projected on the semiconductor substrate 1.

Figure 2:
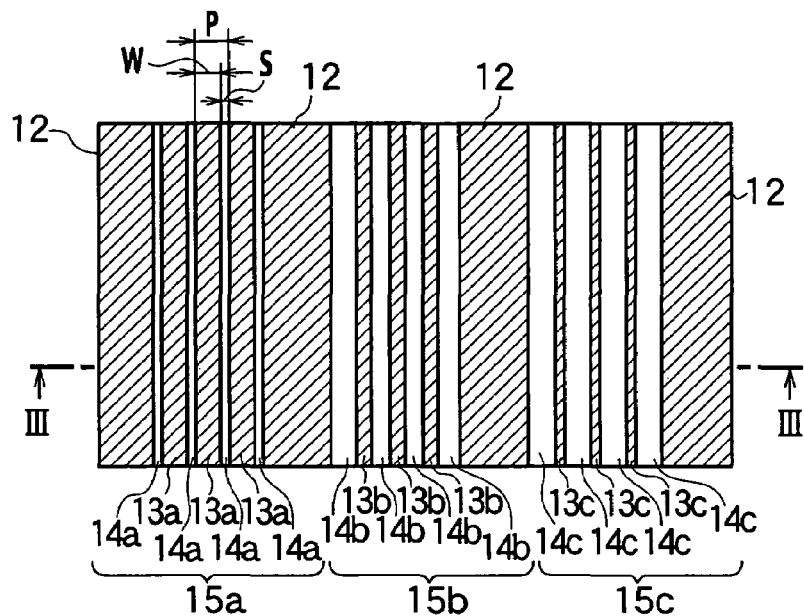
FIG. 2 is a plan view illustrating an example of L/S patterns for an exposure dose monitor mark according to the embodiment of the present invention.
Figure 3:
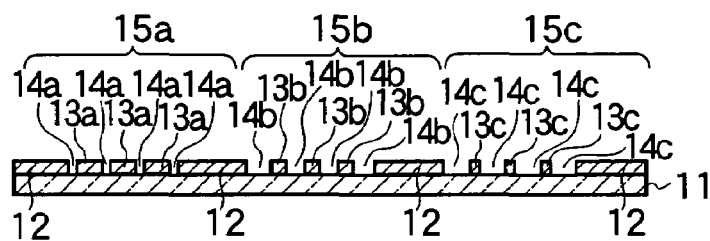
FIG. 3 is a cross-sectional view of the L/S patterns taken along line III-III in FIG. 2.

As shown in FIGS. 2 and 3, the photomask 4 has an expose dose monitor mark having a plurality of line and space (L/S) patterns 15a to 15c, providing a diffraction grating, amid an opaque film 12 disposed on a surface of a transparent substrate 11. For example, in the L/S pattern 15a, a plurality of lines 13a having a line width W are provided in parallel between a plurality of spaces 14a having a space width S, at a pitch P. Similarly, in the L/S patterns 15b and 15c, a plurality of lines 13b and 13c are provided in parallel between a plurality of spaces 14b and 14c, at the pitch P, respectively. Although the pitch P for the L/S patterns 15a to 15c are the same, the space width S or the line width W are different from one another. For example, as shown in FIG. 2, the space width S is smallest for the L/S pattern 15a, and is largest for the L/S pattern 15c.

The pitch P for the L/S patterns 15a to 15c is less than a resolution limit of the exposure tool, and is provided as follows;

$$P < \lambda / \{(1+\sigma)*NA\}. \quad (1)$$

When the L/S patterns 15a to 15c provided on the photomask 4 are illuminated by the illumination optical system 3 of the exposure tool, the first order and higher order diffraction light transmitted through the L/S patterns 15a to 15c from the illumination light, is blocked by the aperture stop of the projection optical system 5. Thus, only a straight traveling zeroth-order diffraction light enters a pupil plane. Here, the "pupil plane" refers to a plane inside the aperture stop.

Accordingly, uniform distribution of the zeroth-order diffracted light is generated on the semiconductor substrate 1, and the L/S patterns 15a to 15c do not form images of the lines 13a to 13c on the semiconductor substrate 1. Thus, the exposure light reaches the surface of the semiconductor substrate 1 so as to generate a flat exposure where the exposure dose varies depending on the opening ratio, i.e., the space width S of the L/S patterns 15a to 15c. Therefore, even when the setting exposure dose of the exposure tool is the same, the observed exposure dose varies depending on the space width S of the L/S patterns 15a to 15c. Moreover, since the lines 13a to 13c of the L/S patterns 15a to 15c are not resolved on the surface of the semiconductor substrate 1, a variation in the exposure dose, due to focusing, can be eliminated. In the case of the exposure tool (λ:248 nm, NA: 0.6, σ: 0.3) used to explain the embodiment, the pitch P satisfying the expression (1) is less than approximately 318 nm. In the embodiment, the pitch P is provided as 300 nm.

Figure 4:
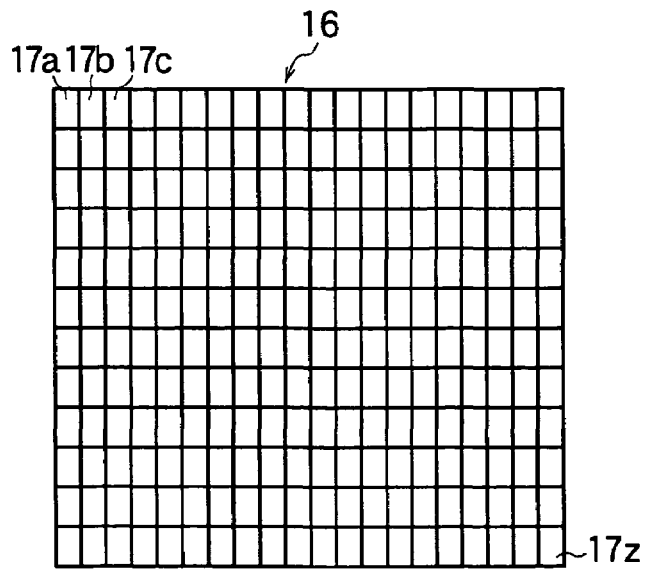
FIG. 4 is a diagram illustrating an example of the exposure dose monitor mark according to the embodiment of the present invention.

In the embodiment, as shown in FIG. 4, an exposure dose monitor mark 16 provided on the photomask 4 is divided into 240 blocks arranged in a matrix such that twenty blocks 17a, 17b, 17c, . . . are arranged in the rightward direction starting from the block 17a at the upper left end of the figure and twelve blocks are arranged in the downward direction terminating at the block 17z at the lower right end of the figure. A L/S pattern similar to any one of the L/S patterns 15a to 15c shown in FIG. 2 is provided in each of the blocks 17a, 17b, 17c, . . . , 17z. In each L/S pattern of the blocks 17a, 17b, 17c, . . . , 17z, the space width S is smallest for the block 17a and largest for the block 17z. For the block 17b, 17c, . . . in between the blocks 17a and 17z, the space width S sequentially increases. In the embodiment, the space width S is varied by an increment of 0.625 nm. When using the photomask 4 with the exposure dose monitor mark 16, a pattern having a stepped intensity distribution of the exposure dose which increases step-by-step in accordance with the space width S of each L/S pattern provided in the blocks 17a, 17b, 17c, . . . , 17z can be projected onto the semiconductor substrate 1. Using the setting exposure dose of the exposure tool, the semiconductor substrate 1 is exposed with an effective exposure dose which is determined in accordance with the opening ratio of each L/S pattern. For example, when the space width S decreases, the effective exposure dose also decreases. Specifically, the space width S of each L/S pattern can be used as a measure for the effective exposure dose corresponding to the constant setting exposure dose.

In an evaluation method of photoresist sensitivity according to the embodiment, the exposure dose monitor mark 16 is projected with the setting exposure dose, using the exposure tool, onto a reference resist film to form a transferred image. The transferred image of the exposure dose monitor mark 16 is a pattern having a thickness distribution of the resist film which varies according to the stepped intensity distribution of the exposure dose which increases step-by-step. In the transferred image of the exposure dose monitor mark 16, the space width S of the L/S patterns corresponding to the effective exposure dose to clear, or remove all of the resist film to reveal an underlying film, can be determined.

When the sensitivity of an inspection target photoresist is measured, a relationship between the setting exposure dose and the space width S corresponding to the effective exposure dose to clear the reference resist film is determined in advance. Then, the exposure dose monitor mark 16 is projected with an inspection setting exposure dose and transferred on an inspection resist film, and a space width S of the L/S pattern where the inspection resist film is cleared is determined. When the determined space width S of the inspection resist film is different from the space width S corresponding to the effective exposure dose to clear of the reference resist film exposed with the inspection setting exposure dose used for evaluation, it is determined that sensitivities of the inspection resist film and reference resist film are different from each other. A space width S of the L/S pattern corresponding to the clearing dose for the setting exposure dose may be defined to be a sensitivity index of a photoresist. By determining an inspection sensitivity index of the inspection resist film and comparing the inspection sensitivity index with a reference sensitivity index of the reference resist film, a difference between the inspection sensitivity index and the reference sensitivity index may be evaluated.

Next, a method for measuring a space width S corresponding to a clearing dose of a L/S pattern will be explained. For example, an anti-reflective coating (ARC) is spin-coated on a semiconductor substrate 1 such as silicon (Si), and is annealed. A thickness of the ARC is, for example, 60 nm. A chemical amplification positive photoresist as a reference photoresist is spin-coated to form a resist film having a thickness of, for example, 0.4 µm. After coating, pre-bake processing is performed, for example, at a temperature of 100° C. for 90 seconds. Note that spin-coating of the ARC and resist film, and the pre-bake processing are performed within a coating-developing system (not shown) coupled to the exposure tool. After completion of the pre-bake processing, the semiconductor substrate 1 is conveyed to the exposure tool and exposed to light so that the exposure dose monitor mark 16 of FIG. 4 provided on the photo mask 4 is projected on the substrate. After completion of the exposure, the semiconductor substrate 1 is conveyed to the coating-developing system. PEB is performed, for example, at a temperature of 100° C. for 90 seconds in the coating-developing system and then development is performed using an alkali developer solution with 0.27 N for 60 seconds. A resist pattern formed on the semiconductor substrate 1 by the development is observed by an optical microscope.

Figure 5:
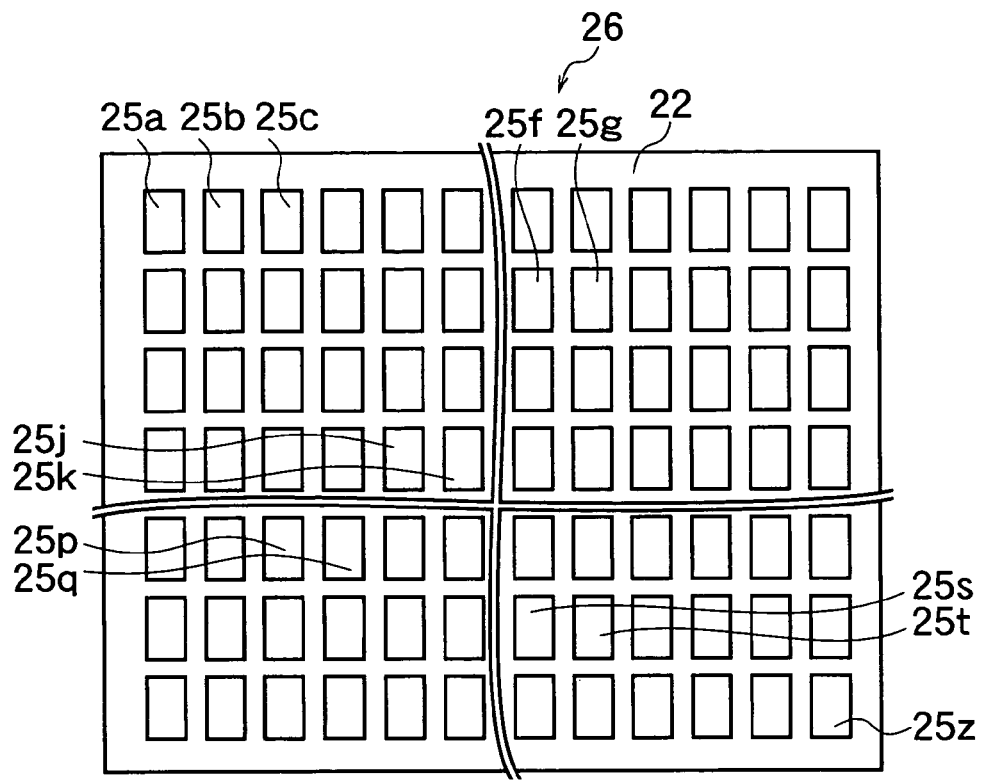
FIG. 5 is a diagram illustrating an example of a resist monitor pattern transferred by the exposure dose monitor mark according to the embodiment of the present invention.

A resist monitor pattern 26 transferred by the exposure dose monitor mark 16 on the resist film 22, as shown in FIG. 5, includes a plurality of transfer areas 25a, 25b, 25c, . . . , 25z formed to correspond to the plurality of blocks 17a, 17b, 17c, . . . , 17z of the exposure dose monitor mark 16. Since each L/S pattern of the plurality of blocks 17a, 17b, 17c, . . . , 17z of the exposure dose monitor mark 16 are not resolved on the resist film, a flat exposure is provided with an exposure dose distribution that increases step-by-step in each of the plurality of transfer areas 25a, 25b, 25c, . . . , 25z. Accordingly, in the resist monitor pattern 26 after development, a resist thickness distribution is generated where a thickness of the resist film in each of the plurality of transfer areas 25a, 25b, 25c, . . . , 25z is changed so as to correspond to the exposure dose distribution.

Figure 6:
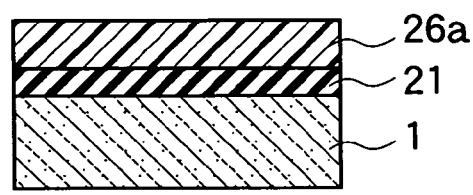
FIG. 6 is a cross-sectional view illustrating an example of a transferred image in the resist monitor pattern according to the embodiment of the present invention.

For example, in the transfer areas 25a to 25c, . . . , 25f, as shown in FIG. 6, a transferred image 26a delineated as a flat resist film is formed on an ARC 21 on the semiconductor substrate 1. The thickness of the flat resist film in each of the transfer areas 25a to 25c, . . . , 25f gradually decreases with an increase in the exposure dose. When observing the transferred image 26a by the optical microscope, the image 26a in each of the transfer areas 25a to 25c, . . . , 25f appears gradually brighter due to interference of the observing light of the optical microscope caused by the thickness of each image 26a. In the transfer areas 25g to 25j, since a dissolution rate of the resist film becomes a minimum due to a standing wave of the exposure light generated by the thin film interference effect in the resist film, it is difficult to observe any change in each image because of small decrease in the thickness of the resist film.

Figure 7:
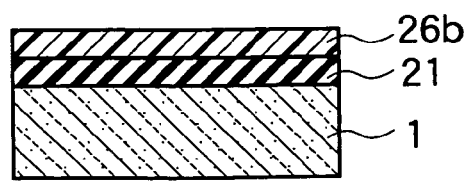
FIG. 7 is a cross-sectional view illustrating another example of the transferred image in the resist monitor pattern according to the embodiment of the present invention.

In a transferred image 26b in each of the transfer areas 25k to 25p, as shown in FIG. 7, a thickness of the resist film further decreases gradually. Then, the underlying ARC 21 can be observed through the resist film by the optical microscope and an observed interference color gradually changes with the thickness decrease of the resist film in each image 26b.

Figure 8:
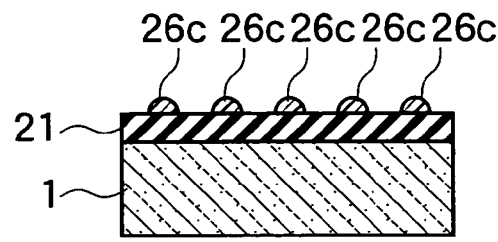
FIG. 8 is a cross-sectional view illustrating yet another example of the transferred image in the resist monitor pattern according to the embodiment of the present invention.
Figure 9:
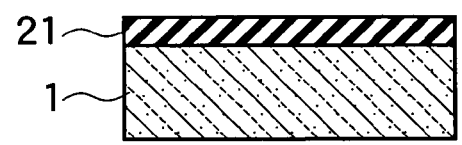
FIG. 9 is a cross-sectional view illustrating still another example of the transferred image in the resist monitor pattern according to the embodiment of the present invention.

In a transferred image 26c in each of the transfer areas 25q to 25s, as shown in FIG. 8, a plurality of clusters of residues of the resist film is formed. Thus, an observed color of each image 26c by the optical microscope becomes inhomogeneous where a portion of the resist film is removed to expose a surface of the underlying ARC 21. Furthermore, in the transfer areas 25t to 25z, as shown in FIG. 9, the resist film is entirely dissolved and the surface of the underlying ARC 21 is exposed. Thus, by observation of the images 26a to 26c of the resist monitor pattern 26 by the optical microscope, the transfer area 26t located on a boundary, from which the resist film is entirely removed, may be easily identified. A space width S of the L/S pattern corresponding to the transfer area 25t in the exposure dose monitor mark 16 is provided as a sensitivity index of the reference photoresist.

Figure 10:
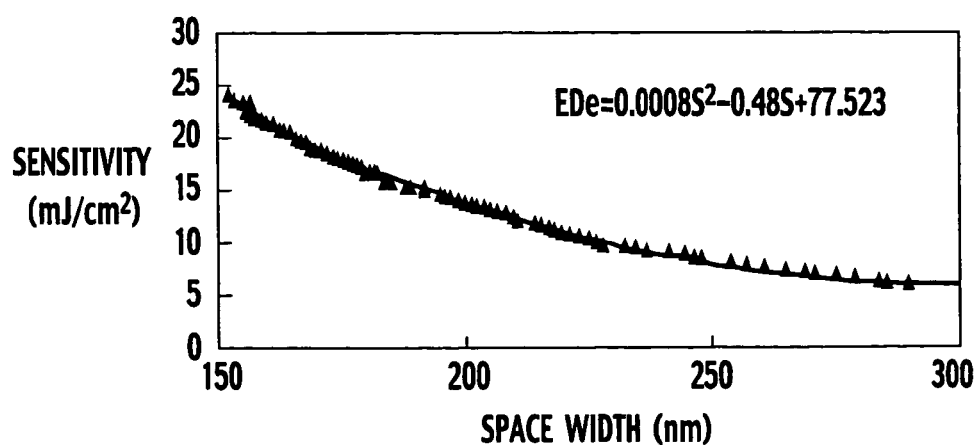
FIG. 10 is a graph illustrating an example of a calibration curve for an evaluation method of a photoresist sensitivity according to the embodiment of the present invention

Using the reference photoresist, space widths S as sensitivity indices are measured by changing the setting exposure doses of the exposure tool, respectively. A setting exposure dose corresponding to each of the measured space widths S is determined as a sensitivity of the reference photoresist. As shown in FIG. 10, a calibration curve is created as one of sensitivity calibration data for the sensitivity EDe with the space width S. The setting exposure dose is increased from 5 mJ/cm$^2$ to 25 mJ/cm$^2$ with an increment of 0.2 mJ/cm$^2$ per step.

For example, when the exposure dose monitor mark 16 is transferred with the setting exposure dose of 7.5 mJ/cm$^2$ on the reference resist film, as shown in FIG. 10, the space width S of the L/S pattern corresponding to the clearing dose is approximately 250 nm. When the space width S of the L/S pattern corresponding to the clearing dose is determined to be 250 nm for an inspection resist film using an inspection setting exposure dose, the sensitivity EDe is provided as 7.5 mJ/cm$^2$. When the inspection setting exposure dose is different from 7.5 mJ/cm$^2$, it can be determined that a sensitivity difference is present between the inspection target photoresist and reference photoresist. In addition, it is permitted for the inspection target photoresist and the reference photoresist are different in composition. As shown in FIG. 10, when the space width S of the clearing dose is smaller, a change in the sensitivity EDe is larger.

A relationship between the space width S and the sensitivity EDe shown in FIG. 10 is determined using the least squares approximation, and is provided as follows;

$$EDe=0.0008*S^2-0.48*S+77.523. \quad (2)$$

In the embodiment, using the equation (2) as sensitivity calibration data, a sensitivity for a photoresist may be also determined by the space width S corresponding to the clearing dose as a sensitivity index. By comparing the sensitivity EDe corresponding to the space width S with the setting exposure dose used for measurement, the sensitivity of the inspection target photoresist relative to the reference photoresist maybe evaluated.

For example, using the inspection setting exposure dose of 7.5 mJ/cm$^2$, the space width S corresponding to the clearing dose is determined to be 245 nm for the inspection resist film. The photoresist sensitivity is determined to be 7.9 mJ/cm$^2$ from FIG. 10, and larger by approximately 5% compared with the reference photoresist.

Furthermore, by the sensitivity difference of the inspection target photoresist regarding the reference photoresist, the sensitivity of the inspection target photoresist is adjusted. Thus, a photoresist having a sensitivity adjusted to a tolerance of the sensitivity of the reference photoresist can be prepared. Accordingly, by the evaluation method according to the embodiment, a sensitivity of a new photoresist lot can be controlled with high accuracy, and furthermore, a photoresist in which sensitivity variation is suppressed can be prepared.

Figure 11:
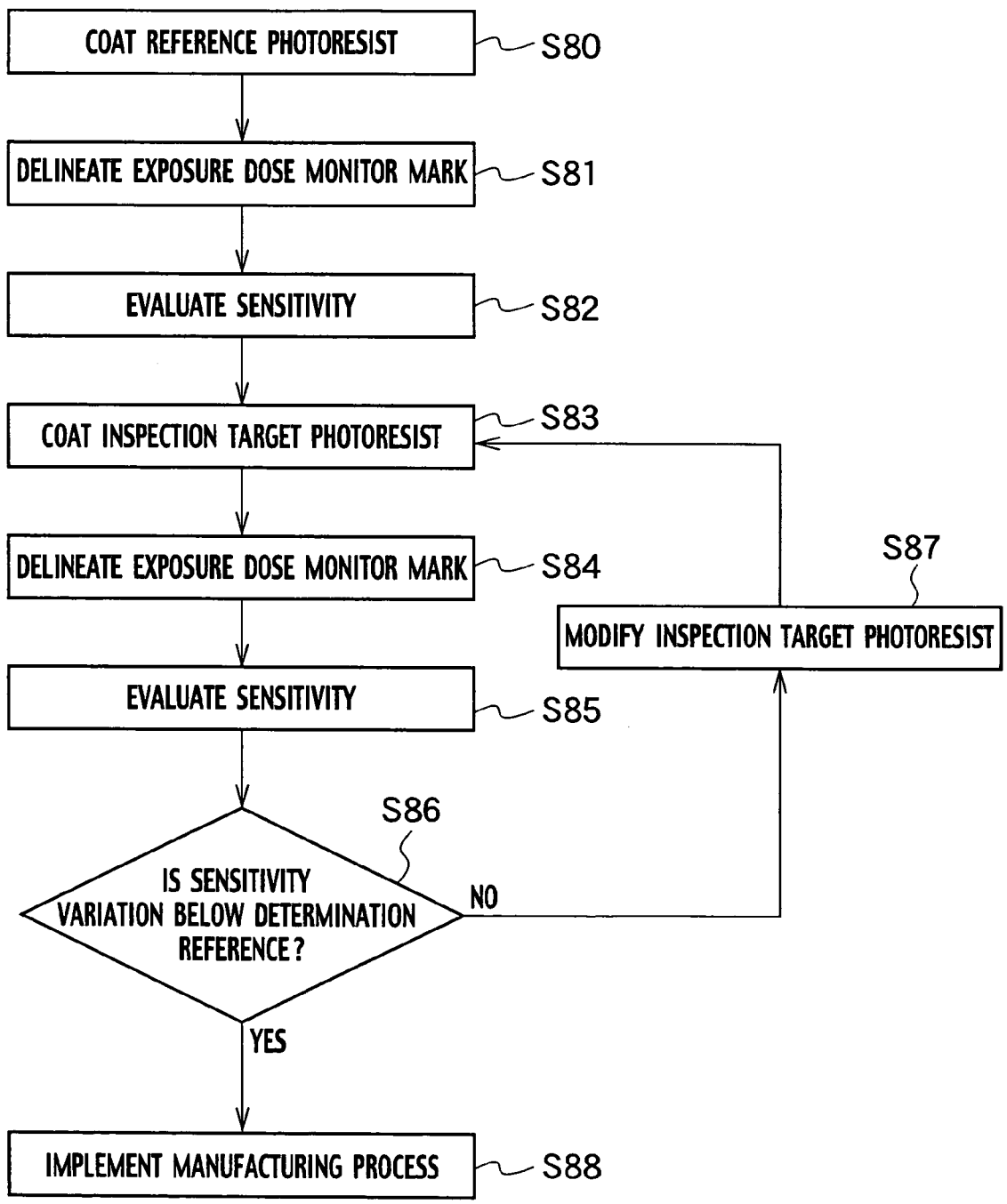
FIG. 11 is a flow chart to explain a manufacturing method of a semiconductor device using the evaluation method according to the embodiment of the present invention.

Next, a method for preparing a photoresist and a method for manufacturing a semiconductor device, using the evaluation method for a photoresist sensitivity according to the embodiment, is described below with reference to a flow chart shown in FIG. 11. Note that as already described in the embodiment, as a sensitivity index for determining photoresist sensitivity, a space width S of a L/S pattern is used which corresponds to a clearing dose associated with the transferred image of the exposure dose monitor mark 16 by a setting exposure dose of an exposure tool. In addition, as a sensitivity index, a physical quantity corresponding to a variation in a transferred image of an exposure dose monitor mark by a setting exposure dose of an exposure tool can also be used. For example, a line width of a L/S pattern or a thickness of a transferred image can also be used as a sensitivity index. Moreover, when a pattern of a transferred image is deformed depending on an effective exposure dose, the amount of pattern deformation can be used as a sensitivity index. Specifically, as described below, a resist film is coated on an ARC. However, a resist film may be coated without an ARC directly on a semiconductor substrate, or on an underlying layer such as an insulating film and a conductive film.

(a) In step S80, a previously prepared reference photoresist is spin-coated to form a reference resist film on an ARC on a semiconductor substrate 1.

(b) The semiconductor substrate 1 and the photomask 4 having the exposure dose monitor mark 16 shown in FIG. 4 are loaded in the exposure tool shown in FIG. 1. In step S81, the exposure dose monitor mark 16 is projected with a setting exposure dose onto the reference resist film. Then, PEB and development processes are implemented so as to delineate the resist monitor pattern 26 shown in FIG. 5.

(c) In step S82, the space width S of the L/S pattern corresponding to a clearing dose is determined by a reference transferred image of the resist monitor pattern 26. Subsequently, another space width S corresponding to another clearing dose is measured by changing the setting exposure dose of the exposure tool. The measured space width S corresponding to each clearing dose is determined as a sensitivity index and the setting exposure dose corresponding to each sensitivity index is determined as the sensitivity. Then, a relationship between the sensitivity index and the sensitivity is determined as sensitivity calibration data.

(d) In step S83, a new lot of photoresist as an inspection target photoresist is newly spin-coated to form an inspection resist film on an ARC on a semiconductor substrate 1.

(e) The semiconductor substrate 1 and the photomask 4 are loaded in the exposure tool. In step S84, the exposure dose monitor mark 16 is projected with an inspection setting exposure dose onto the inspection resist film. Then, PEB and development processes are implemented so as to delineate an inspection resist monitor pattern.

(f) In step S85, the space width S of L/S patterns corresponding to clearing dose is measured as an inspection sensitivity index for an inspection transferred image of the inspection resist monitor pattern. An inspection photoresist sensitivity corresponding to the inspection sensitivity index for the inspection transferred image is determined.

(g) In step S86, a sensitivity difference between the sensitivity corresponding to the inspection setting exposure dose and the inspection photoresist sensitivity of the inspection resist film is calculated and compared to a determination reference for a photoresist sensitivity.

(h) When the sensitivity difference is not less than the determination reference, in step S87, the composition of the inspection target photoresist is modified based on a previously measured relationship for a sensitivity variation with an amount of a photoresist additive. After modification, processing from step S83 to step S86 to calculate a sensitivity difference of the modified inspection target photoresist is repeated until the sensitivity difference is less than the determination reference. Thus, the inspection target photoresist is modified to be a manufacturing photoresist.

(i) In step S88, the manufacturing photoresist is spin-coated to form a manufacturing resist film on an ARC on a manufacturing semiconductor substrate. The manufacturing semiconductor substrate is loaded in the exposure tool and a circuit pattern on a manufacturing photomask is transferred on the manufacturing resist film. Using a manufacturing resist pattern delineated on the manufacturing resist film by the circuit pattern, the manufacturing semiconductor substrate 1 is processed to manufacture a semiconductor device.

According to the embodiment, a new lot of manufacturing photoresist can be prepared by modifying the sensitivity with high accuracy so that the sensitivity difference of the reference photoresist is less than the determination reference. Additionally, since the new lot of photoresist for which the sensitivity is highly accurately controlled can be used in a manufacturing process for a semiconductor device, the semiconductor device can be manufactured with a high yield.

Subsequently, a method is described for preparing a new lot of manufacturing photoresist to which the method for evaluation of photoresist sensitivity according to the embodiment is applied.

A reference photoresist is prepared according to the following recipe. A polymer prepared by protecting hydroxyl (35%) of phenol in polyhydroxystyrene with tert-butoxycarbonyl is dissolved in propylene glycol of nine parts by weight. Triphenylsulfoniumfluorosulfonic acid of 5% by weight is added to the quantity of solid polymer as a photo-induced acid generator (photosensitive agent). Furthermore, 5% mole of triphenylamine is added as an acid trapping agent to the photo-induced acid generator to prepare a reference photoresist. The exposure dose monitor mark 16 shown in FIG. 4 is transferred on the prepared reference resist film using the exposure tool and sensitivity calibration data for a photoresist sensitivity is created.

Subsequently, a new lot of photoresist as an inspection target photoresist is prepared according to a recipe similar to that for the reference photoresist. The inspection target photoresist is spin-coated to form an inspection resist film on a surface of a semiconductor substrate 1. Using the method for evaluation of photoresist sensitivity according to the embodiment, a space width S of a L/S pattern corresponding to a clearing dose is measured for the inspection resist film. As a result, the sensitivity of the inspection target photoresist is smaller by 5% than that of the reference photoresist.

Then, by a relationship for a sensitivity variation with the amount of acid trapping agent to be added, which is previously measured using a sensitivity calibration photoresist, the acid trapping agent corresponding to the sensitivity difference with respect to the reference photoresist is added to the inspection target photoresist to modify the sesitivity. The modified inspection target photoresist is spin-coated on the semiconductor substrate and the photoresist sensitivity is evaluated by the method for evaluation of photoresist sensitivity according to the embodiment. As a result, the inspection target photoresist can be modified so that the sensitivity difference with respect to the reference photoresist is less than 1%, which is within an acceptable range of error.

Furthermore, contrary to the above example, when the exposure dose allowing the new lot of photoresist to be completely dissolved is greater, for example, by 5% than that for the reference photoresist, based on the previously measured relationship for the sensitivity variation, the acid trapping agent may be added by an amount corresponding to the sensitivity difference with respect to the reference photoresist.

In the above explanation, an exposure dose monitor mark 16 is used in which a group of L/S patterns varying the space width S serving as a diffraction grating is provided. However, a diffraction grating is not limited to the L/S pattern. A diffraction grating can be provided also by holes or diamond-shaped patterns which are arranged periodically.

Furthermore, a diffraction grating may be provided by a pattern of openings. In each of the openings, a translucent film having a stepped thickness variation is provided on a transparent substrate of a photomask, so as to vary a ratio of intensities of lights transmitted through each translucent film of the openings step-by-step. Here, each of the translucent films has a sufficiently large area to allow a flat exposure in which an exposure dose on a surface of a semiconductor substrate 1 does not vary due to a variation in focusing.

In the evaluation method of photoresist sensitivity according to the embodiment, although the space width of the L/S pattern corresponding to the clearing dose, in which a resist film is entirely dissolved and removed, is used as a sensitivity index, the embodiment is not limited thereto. For example, it is also possible to evaluate a sensitivity by measuring a remaining resist thickness of a reference resist film as a sensitivity corresponding to a setting exposure dose, and determining a thickness difference of a remaining resist thickness of an inspection resist film.

Furthermore, instead of a remaining resist thickness after development, a resist film thickness measured after exposure or PEB may be used. In a photochemical reaction resulting from exposure to light, a polymer of a photosensitive compound contained in a resist film varies the degree of chain polymerization by breaking cross-linked polymers. As a result, a thickness difference occurs between an exposed portion and a shielded portion of the resist film.

FIRST MODIFICATION

Figure 12:
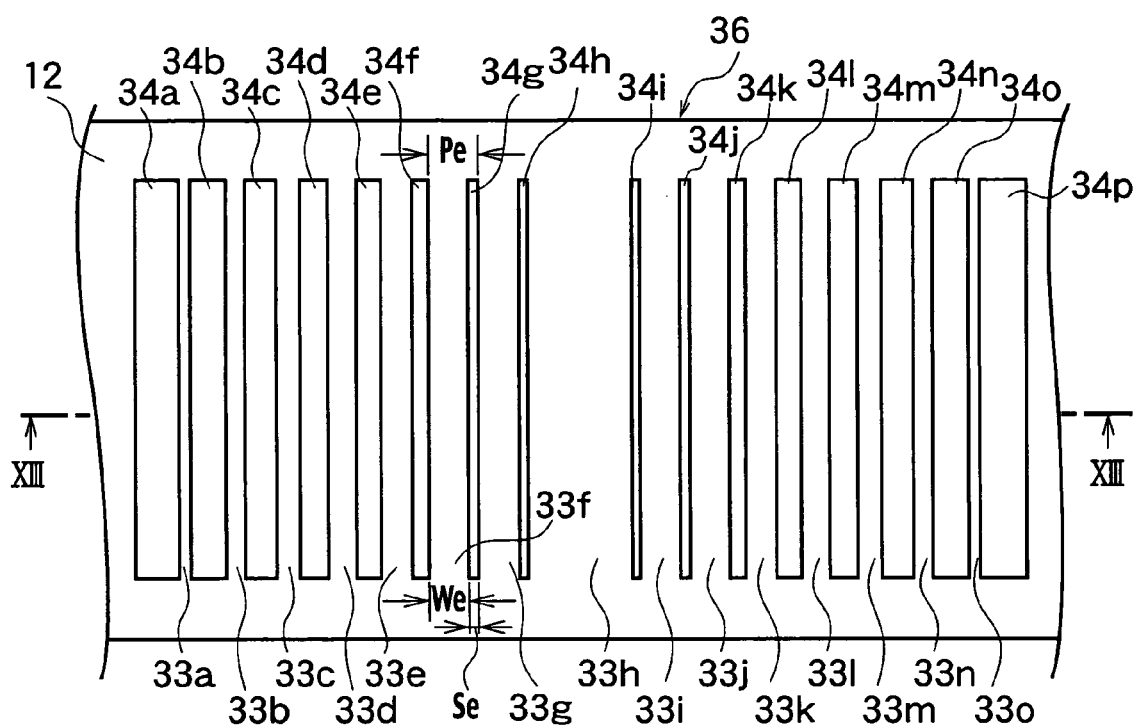
FIG. 12 is a plan view illustrating an example of an exposure dose monitor mark according to a first modification of the embodiment of the present invention.
Figure 13:
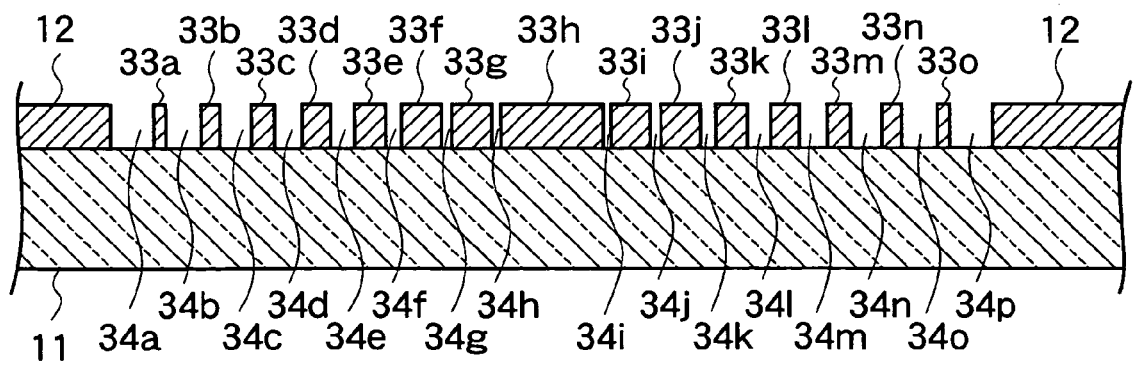
FIG. 13 is a cross-sectional view of the exposure dose monitor mark taken along line XIII-XIII in FIG. 12 according to the first modification of the embodiment of the present invention.

An exposure dose monitor mark 36 used in a method for evaluation of photoresist sensitivity according to a first modification of the embodiment of the invention, as shown in FIG. 12 and 13, is a diffraction grating formed by a L/S pattern in which an opening ratio is continuously changed in an opaque film 12 on a transparent substrate 11. For example, the opening ratio provided by a space widths Se of a plurality of spaces 34a to 34p revealing a surface of the transparent substrate 11 and a line widths We of a plurality of lines 33a to 33o of an opaque material is increased by a constant ratio from the center portion of the exposure dose monitor mark 36 to both ends in a horizontal direction. The L/S pattern is periodically arranged with a constant pitch Pe. The opening ratio is 0% in the line 33h positioned at the center of the exposure dose monitor mark 36 and a maximum of nearly 100% in the lines 33a and 33o at the left and right ends. When the pitch Pe is less than the resolution limit of the exposure tool shown in FIG. 1 represented by the expression (1), transferred diffraction grating patterns are not resolved on the semiconductor surface 1. In the first modification of the embodiment, the pitch Pe is also determined to be 300 nm, which is less than the resolution limit of the exposure tool. Accordingly, the diffraction grating pattern of the exposure dose monitor mark 36 may not be resolved on a resist film. The intensity of exposure light that is diffracted and transmitted through the spaces 34a to 34p between the lines 33a to 33o is varied, depending on the opening ratio. A resist pattern is delineated on a resist film by projecting the exposure dose monitor mark 36. Inclined sidewalls are formed at both ends of the resist pattern in a direction corresponding to the periodically arranged direction of the lines 33a to 33o and spaces 34a to 34p, depending on a sensitivity curve of the resist film. Further, both ends of the resist pattern shift so as to decrease a width of the resist pattern in response to the exposure dose. By determining a width of the transferred resist pattern of the exposure dose monitor mark 36 as a sensitivity index, sensitivity of a photoresist may be measured. The first modification of the embodiment is different in that the diffraction grating having the L/S pattern in which the opening ratio is increased step-by-step in one direction from the center to both ends is used as the exposure dose monitor mark 36, and the width of the transferred image of the exposure dose monitor mark 36 is used as a sensitivity index. Other configurations of the first modification are similar to that of the embodiment, and therefore, repeated description is omitted.

Figure 14:
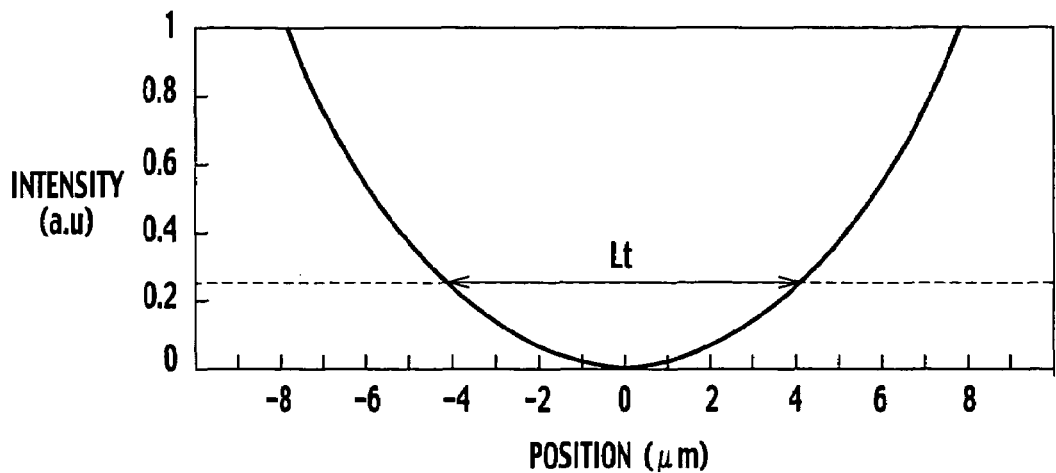
FIG. 14 is a graph illustrating an example of an intensity distribution of an exposure light through the exposure dose monitor mark according to the first modification of the embodiment of the present invention.

FIG. 14 illustrates an intensity distribution of light provided by projecting the exposure dose monitor mark 36 shown in FIG. 12, measured on a surface of the resist film on the semiconductor substrate 1 in a direction corresponding to a cross section XIII-XIII. For example, a position of the surface of the resist film corresponding to a central position of the line 33h of the exposure dose monitor mark 36 is determined as an origin. Intensity of exposure light is 0 at the original position of the exposure dose monitor mark 36 and is 1 at the positions of the spaces 34a and 34p at the left and right ends respectively. Since only zeroth-order diffraction light diffracted by the exposure dose monitor mark 36 is irradiated onto the surface of the resist film, the intensity distribution of light is in proportion to a square of an area of the space width Se of each of the spaces 34a to 34p.

Thereafter, a procedure for measuring photoresist sensitivity is described below using the exposure dose monitor mark 36 providing the intensity distribution of exposure light shown in FIG. 14.

Figure 15:
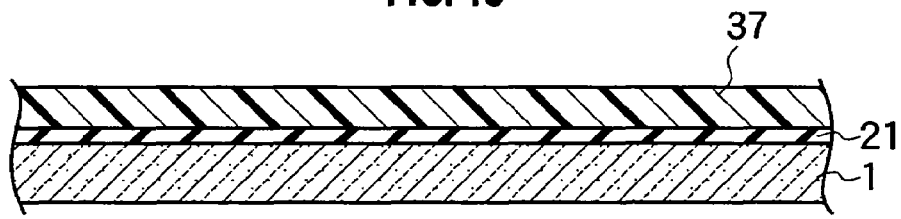
FIGS. 15 to 17 are cross-sectional views of an example of the evaluation method of a photoresist sensitivity according to the first modification of the embodiment of the present invention.
Figure 16:
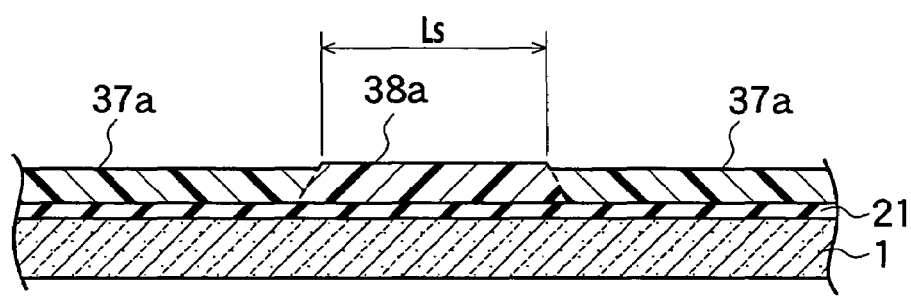

First, as shown in FIG. 15, a resist film 37 is spin-coated on the surface of an ARC 21 on a semiconductor substrate 1. The exposure dose monitor mark 36 is projected on the resist film 37 by the exposure tool. In the first modification of the embodiment, since a positive photoresist is used, cross-linking of polymers as a constituent of the photoresist is broken in a portion irradiated by the exposure light. Accordingly, as shown in FIG. 16, after exposure or PEB, a transferred image 38a is formed as a latent image in a shielded region between an exposed resist films 37a, so as to correspond to the exposure dose monitor mark 36. Since the exposed resist film 37a and the transferred image 38a have polymer structures different from each other, a resist thickness, optical characteristics such as a refraction index and the like, are different from each other. The exposed resist films 37a are dissolved by development processing after PEB, and as shown in FIG. 17, a transferred image 38b is formed on the ARC 21.

Figure 18:
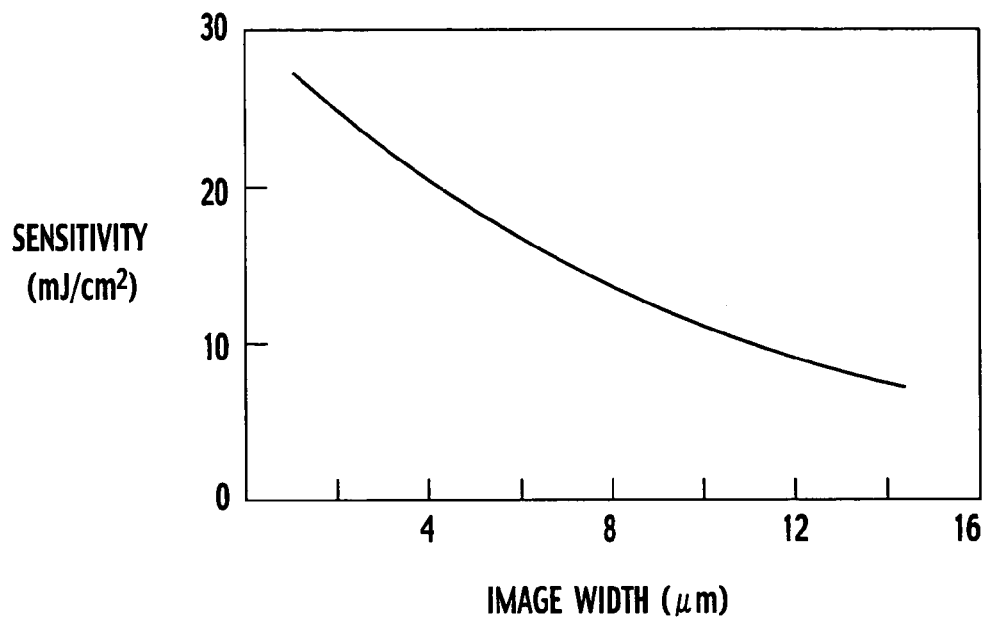
FIG. 18 is a graph illustrating an example of a calibration curve for the evaluation method according to the first modification of the embodiment of the present invention.

In the transferred images 38a and 38b, inclined sidewalls are formed at left and right ends of the images, depending on the intensity distribution of exposure light shown in FIG. 14 and the sensitivity curve of photoresist. Further, the left and right ends shift so as to shrink image widths Ls and Lt of the transferred images 38a and 38b in response to the exposure dose. The image widths Ls, Lt of the transferred images 38a and 38b can be measured by a surface profiler or an optical line width measurement system. Using a reference photoresist, exposure processing is implemented by varying a setting exposure dose of the exposure tool. Then, based on a relationship between the image width Ls or Lt and the setting exposure dose, as shown in FIG. 18, a calibration curve representing a relationship between a sensitivity index and a photoresist sensitivity EDe can be determined. By using the relationship shown in FIG. 18 as sensitivity calibration data, photoresist sensitivity of an inspection resist film may be highly accurately evaluated.

For example, the exposure dose monitor mark 36 is delineated with a reference setting exposure dose of the exposure tool on an inspection resist film coated on a semiconductor substrate 1 using an inspection target photoresist. A width of a transferred image provided after development is measured by a surface profiler or an optical line width measurement system. Photoresist sensitivity is determined using the calibration curve of FIG. 18, based on the measured width of the transferred image. A relative photoresist sensitivity of the inspection target photoresist to the reference photoresist can be determined from the determined photoresist sensitivity.

Figure 17:
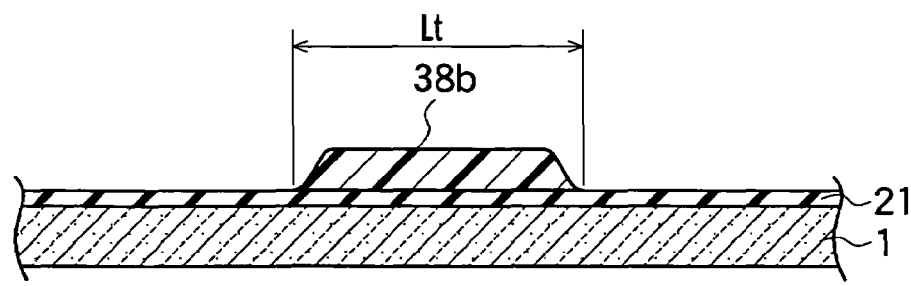
Figure 19:
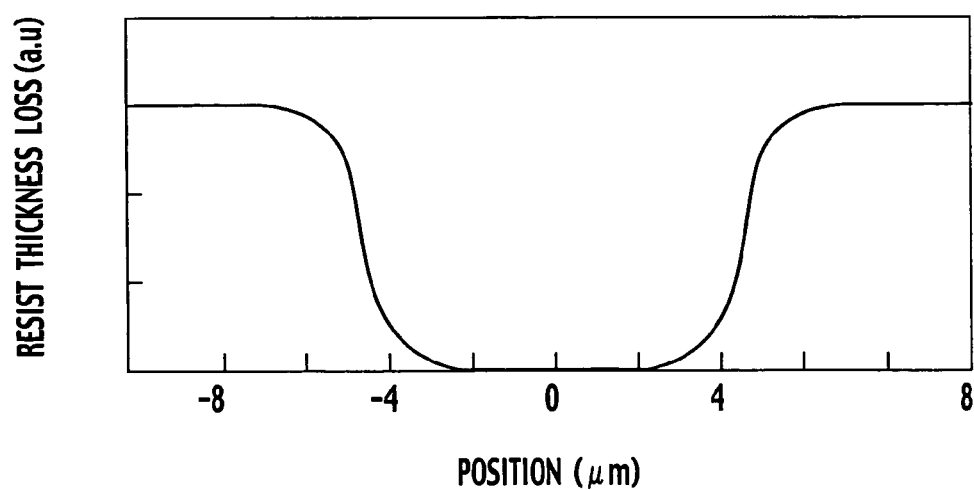
FIG. 19 is a diagram illustrating an example of an amount of a resist thickness loss for a transferred image in the resist monitor pattern according to the first modification of the embodiment of the present invention.

Furthermore, when the amount of resist thickness loss is measured after development by a surface profiler, as shown in FIG. 19, a thickness profile is provided, in which the amount of resist thickness loss changes at positions corresponding to the inclined sidewalls at the left and right ends of the transferred image 38b shown in FIG. 17. Thus, using of the amount of resist thickness loss, a sensitivity index corresponding to photoresist sensitivity, like as the image width Lt of the transferred image 38b, may be provided. Accordingly, it is possible that a calibration curve similar to that shown in FIG. 18 is provided and the photoresist sensitivity of the inspection resist film can be evaluated. The amount of resist thickness loss may be measured using an optical thickness measurement system instead of the surface profiler.

Figure 20:
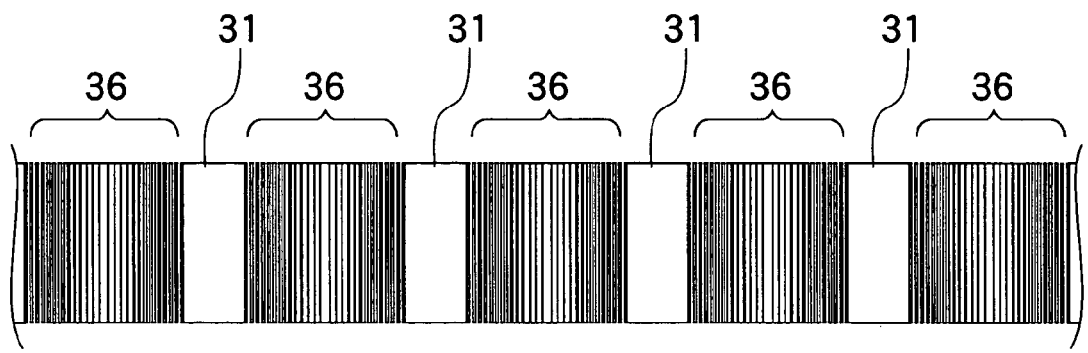
FIG. 20 is a plan view illustrating another example of the exposure dose monitor mark according to the first modification of the embodiment of the present invention.
Figure 21:
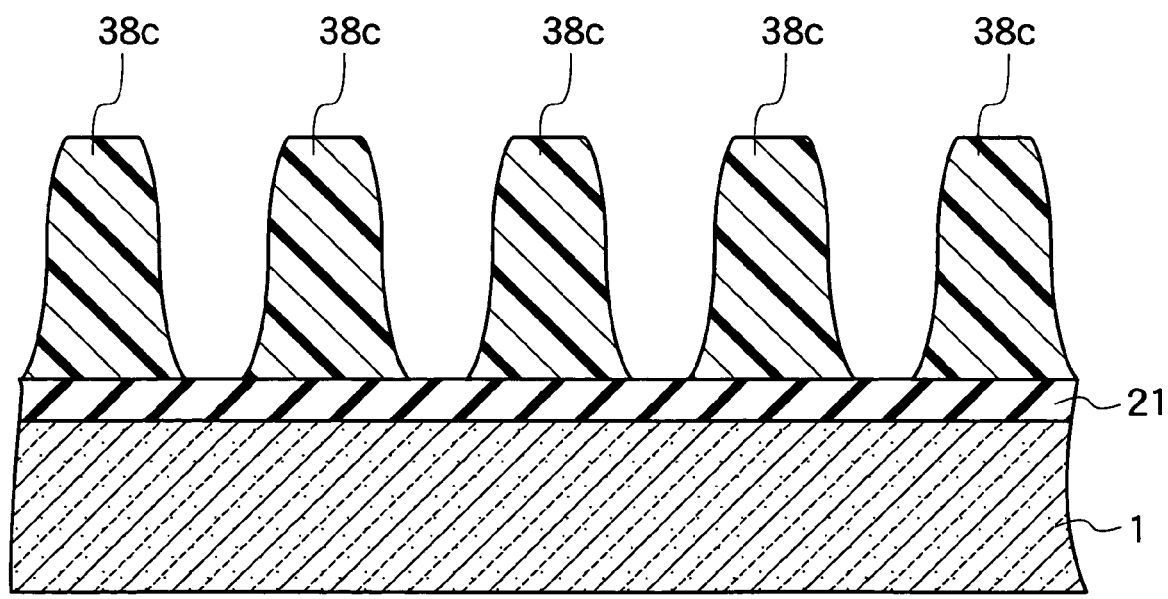
FIG. 21 is a cross-sectional view illustrating an example of a transferred image by the exposure dose monitor mark shown in FIG. 20 according to the first modification of the embodiment of the present invention.

Furthermore, to measure the amount of resist thickness loss, as shown in FIG. 20, a photomask having a plurality of exposure dose monitor marks 36 periodically arranged between openings 31 at equal intervals may be used. In this case, as shown in FIG. 21, the amount of resist thickness loss can be measured using diffraction grating scatterometry for a plurality of transferred images 38c which are delineated on a resist film coated on a surface of an ARC 21 on a semiconductor substrate 1. In the scatterometry, light is incident at a specific angle on a pattern of the transferred images 38c and intensity of a diffraction light is measured. By reference to a relationship between the diffraction intensity of a previously determined pattern profile and the measured diffraction intensity, a thickness distribution of the transferred images 38c can be determined. Thus, by use of the relationship between a sensitivity index determined from the resist thickness loss corresponding to the transferred images 38c and a photoresist sensitivity, a photoresist sensitivity of an inspection resist film may be highly accurately evaluated.

It should be appreciated that the exposure dose monitor mark 36 according to the first modification of the embodiment is provided by using a symmetrical L/S pattern having an opening ratio which increases from the center portion to the left and right ends. However, needless to say, an asymmetrical L/S pattern having an opening ratio which varies from approximately 0% to 100% in one direction may be used. In a transferred image on a resist film, one end of the image projected from one end of the L/S pattern having the opening ratio of 0% does not shift, and the other end of the image projected from the other end of the L/S pattern having the opening ratio of 100% shifts so as to decrease a width of the image and to form an inclined sidewall.

SECOND MODIFICATION

Figure 22:
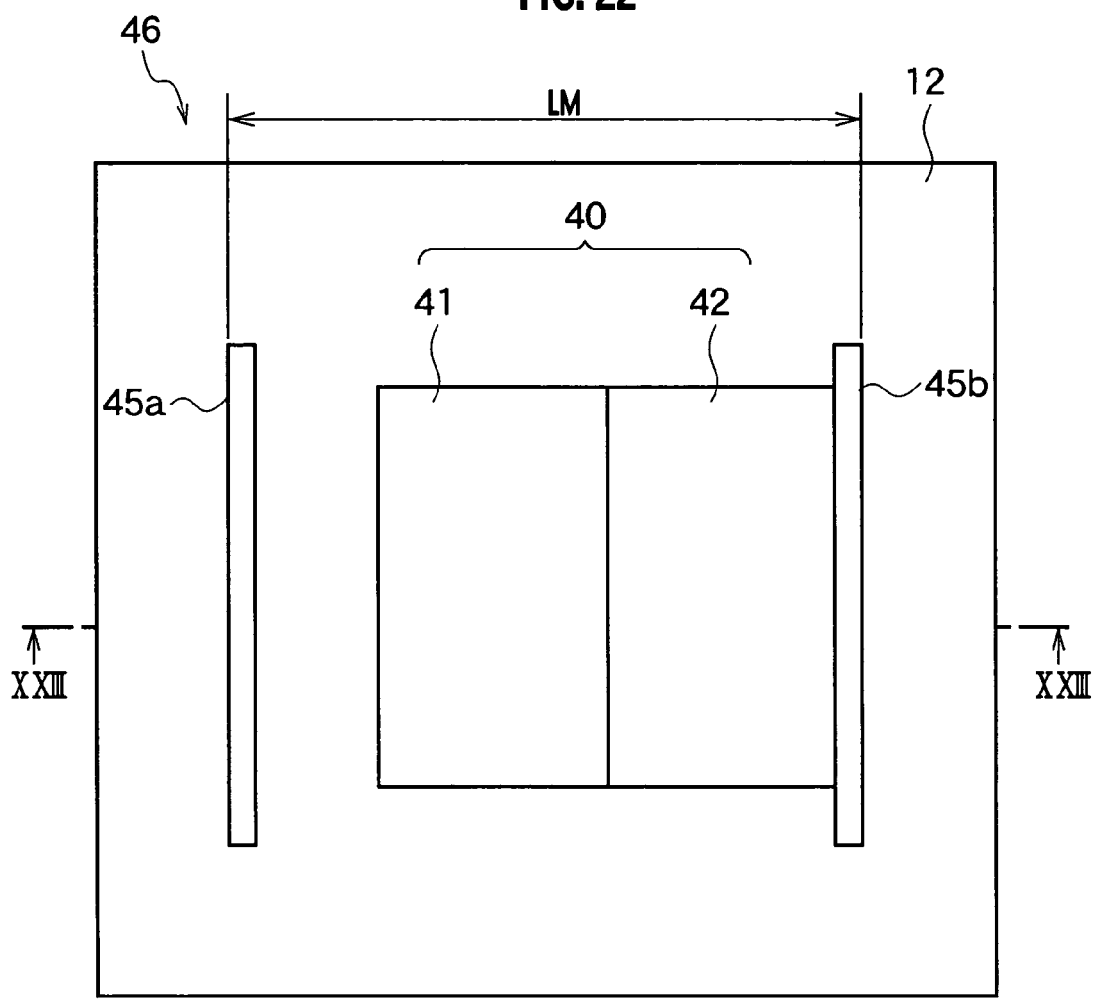
FIG. 22 is a plan view illustrating an example of an exposure dose monitor mark according to a second modification of the embodiment of the present invention.
Figure 23:
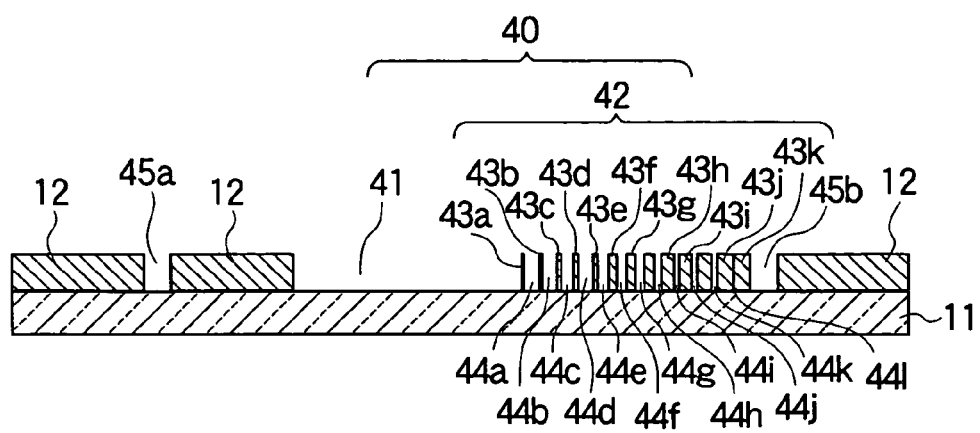
FIG. 23 is a cross-sectional view of the exposure dose monitor mark taken along line XXIII-XXIII in FIG. 22 according to the second modification of the embodiment of the present invention.

As shown in FIG. 22 and 23, an exposure dose monitor mark 46 used in an evaluation method of photoresist sensitivity according to a second modification of the embodiment of the invention includes position detection patterns 45a and 45b extending, for example, in a vertical direction of the figure. The position detection patterns 45a, 45b are provided in an opaque film 12 on a transparent substrate 11 so as to face each other in a direction orthogonal to the longitudinal direction thereof. An exposure dose monitor pattern 40 has an opening 41 and a diffraction grating 42 between the position detection patterns 45a and 45b. The opening 41 is provided on a side of the position detection pattern 45a interposed with the opaque film 12. The diffraction grating 42 is provided in close proximity to the opening 41 and the position detection pattern 45b therebetween. Note that although the exposure gradient 42 is provided in close proximity to the position detection pattern 45b, the diffraction grating 42 and the position detection pattern 45b may be provided apart from each other while the opaque film 12 is interposed therebetween.

The diffraction grating 42 is an L/S pattern having an opening ratio of line widths of a plurality of lines 43a to 43k of an opaque material and space widths of spaces 44a to 44l revealing the transparent substrate 11, varying step-by-step with a constant ratio in one direction. The L/S pattern is periodically arranged at a constant pitch less than a resolution limit of an exposure tool represented by the expression (1). The opening ratio, i.e., the space width decreases from a side of the line 43a of the diffraction grating 42 abutting the opening 41, to a side of the line 43k abutting the position detection pattern 45b. The opening ratio is 100% in the opening 41 abutting the diffraction grating 42 and 0% in the line 43k. In the second modification of the embodiment, a distance LM from the left end of the position detection pattern 45a to the right end of the position detection pattern 45b is approximately 30 µm. Furthermore, the widths of the position detection patterns 45a, 45b in a direction along the cross section XIII-XIII are approximately 2 µm and the widths of the opening 41 and the diffraction grating 42 are approximately 14 µm and 8 µm, respectively.

Figure 24:
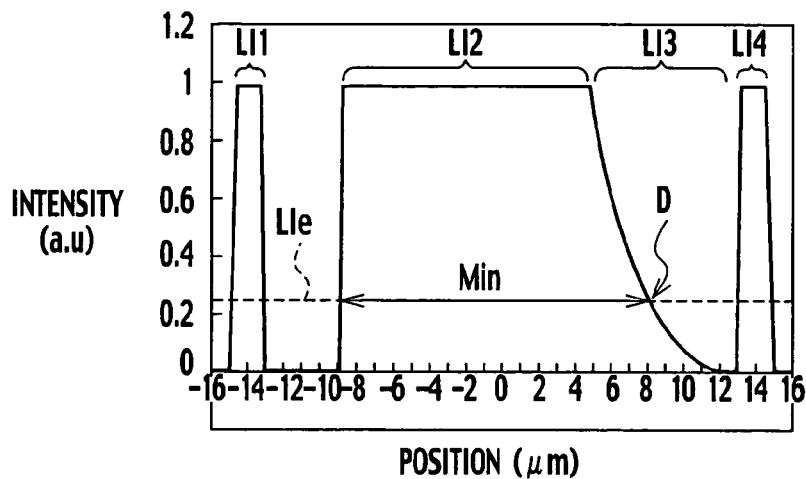
FIG. 24 is a graph illustrating an example of an intensity distribution of the exposure light for the exposure dose monitor mark according to the second modification of the embodiment of the present invention.

When the exposure monitor mark 46 is projected onto the semiconductor substrate 1 by the exposure tool, an intensity distribution of exposure light on the semiconductor substrate 1 maybe provided as shown in FIG. 24. Note that an original position for the intensity distribution of exposure light is a position corresponding to a center between the position detection patterns 45a, 45b. Moreover, the intensity of exposure light is normalized by an amount of exposure light transmitted through the position detection patterns 45a, 45b or the opening 41. Accordingly, as shown in FIG. 24, intensity distribution portions LI1, LI4 and LI2 of exposure light transmitted through the position detection patterns 45a, 45b and the opening 41 respectively have a constant value of one. An intensity distribution portion LI3 of exposure light transmitted through the diffraction grating 42 decreases in a direction from an end abutting the opening 41 to another end abutting the position detection pattern 45b, depending the space widths of the spaces 44a to 44l.

Figure 25:
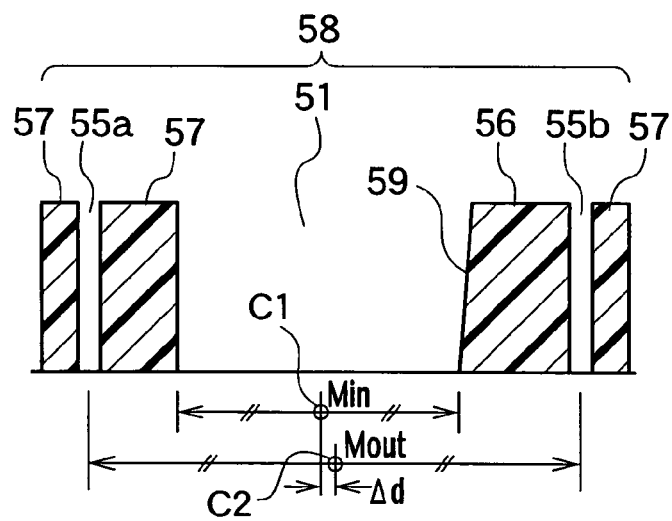
FIG. 25 is a cross-sectional view illustrating an example of a transferred image in a resist monitor pattern according to the second modification of the embodiment of the present invention.

In FIG. 24, for example, assume that an intensity of exposure light corresponding to a clearing dose of a resist film is an effective exposure dose LIe of exposure light. An area of a width Min from a position D at which an intensity in the intensity distribution portion LI3 corresponds to the effective exposure dose Lie, to a position corresponding to the left end of the opening 41 is determined as a clearing dose area. Accordingly, in a resist monitor pattern 58, as shown in FIG. 25, position detection resist openings 55a and 55b corresponding to the position detection patterns 45a and 45b of the exposure dose monitor mark 46, and a resist opening 51 corresponding to an area in the diffraction grating 42 including the opening 41 and a portion ranging from the right end of the opening 41 to a position corresponding to the position D, are formed between resist films 57. Moreover, an inclined sidewall 59 is formed at the left end of a transferred image 56 corresponding to the diffraction grating 42. Note that in FIG. 25, only the resist monitor pattern 58 is shown for simplification and illustration of underlying layers, such as an ARC, semiconductor substrate and the like, is omitted.

A width of the resist opening 51 corresponds to the width Min ranging from the position D to the left end of the opening 41 in the intensity distribution portion LI3 shown in FIG. 24. When the setting exposure dose of the exposure tool is varied, the effective exposure dose LIe varies and the position D corresponding to the clearing dose on the intensity distribution portion LI3 varies. For example, when the setting exposure dose increases, the position D is displaced in a direction toward the position detection pattern 45b and the width Min increases. Moreover, a width Mout between centers of the position detection resist openings 55a, 55b does not vary, even when the setting exposure dose of the exposure tool is varied. Accordingly, an amount of relative displacement Δd representing a difference between a center C1 of the width Min and a center C2 of the width Mout corresponds to a variation in a photoresist sensitivity. The second modification of the embodiment is different from the embodiment or the first modification of the embodiment in that the amount of relative displacement Δd determined by measuring the center C1 of the resist opening 51 and the center C2 between the position detection resist openings 55a and 55b is determined as a sensitivity index to evaluate photoresist sensitivity. The remainder of the modification is similar to that of the embodiment and the first modification, and repeated explanation thereof is omitted.

Figure 26:
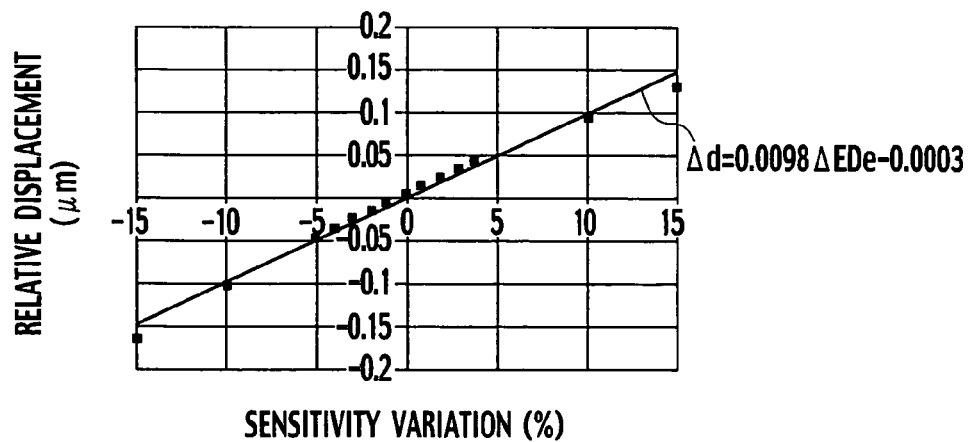
FIG. 26 is a graph illustrating an example of a calibration curve for an evaluation method of a photoresist sensitivity according to the second modification of the embodiment of the present invention.

By varying the setting exposure dose of the exposure tool, a plurality of resist monitor patterns 58 are delineated on reference resist films by transferring the exposure dose monitor mark 46. Then, each center C1 of the resist openings 51 and each center C2 between the position detection resist openings 55a, 55b are measured by use of an overlay inspection system and the like. As shown in FIG. 26, a relationship between a sensitivity variation ΔEDe representing a percentage variation of each setting exposure dose from a reference setting exposure dose and the amount of relative displacement Δd measured for each setting exposure dose is provided as a calibration curve. In addition, the relationship between the sensitivity variation ΔEDe and the relative displacement Δd is determined using the least squares approximation, as follows;

$$\Delta d = 0.0098 * \Delta EDe - 0.0003. \quad (3)$$

In the second modification of the embodiment, the equation (3) is used as sensitivity calibration data for evaluating photoresist sensitivity and the amount of relative displacement Δd corresponding to a clearing dose of an inspection resist film is determined as a sensitivity index. Thus, a relative sensitivity of an inspection target photoresist to a reference photoresist may be evaluated by use of the sensitivity variation ΔEDe.

For example, the exposure dose monitor mark 46 is transferred with a reference setting exposure dose of the exposure tool on an inspection resist film. A relative displacement Δd for a transferred image determined after development is measured by an overlay inspection system and the like. Based on a measured amount of relative displacement Δd, a sensitivity variation ΔEDe for the inspection resist film is determined using the calibration curve of FIG. 26 or the relationship in the equation (3). Based on the determined sensitivity variation ΔEDe, a relative sensitivity of the inspection target photoresist to the reference photoresist can be provided.

Figure 27:
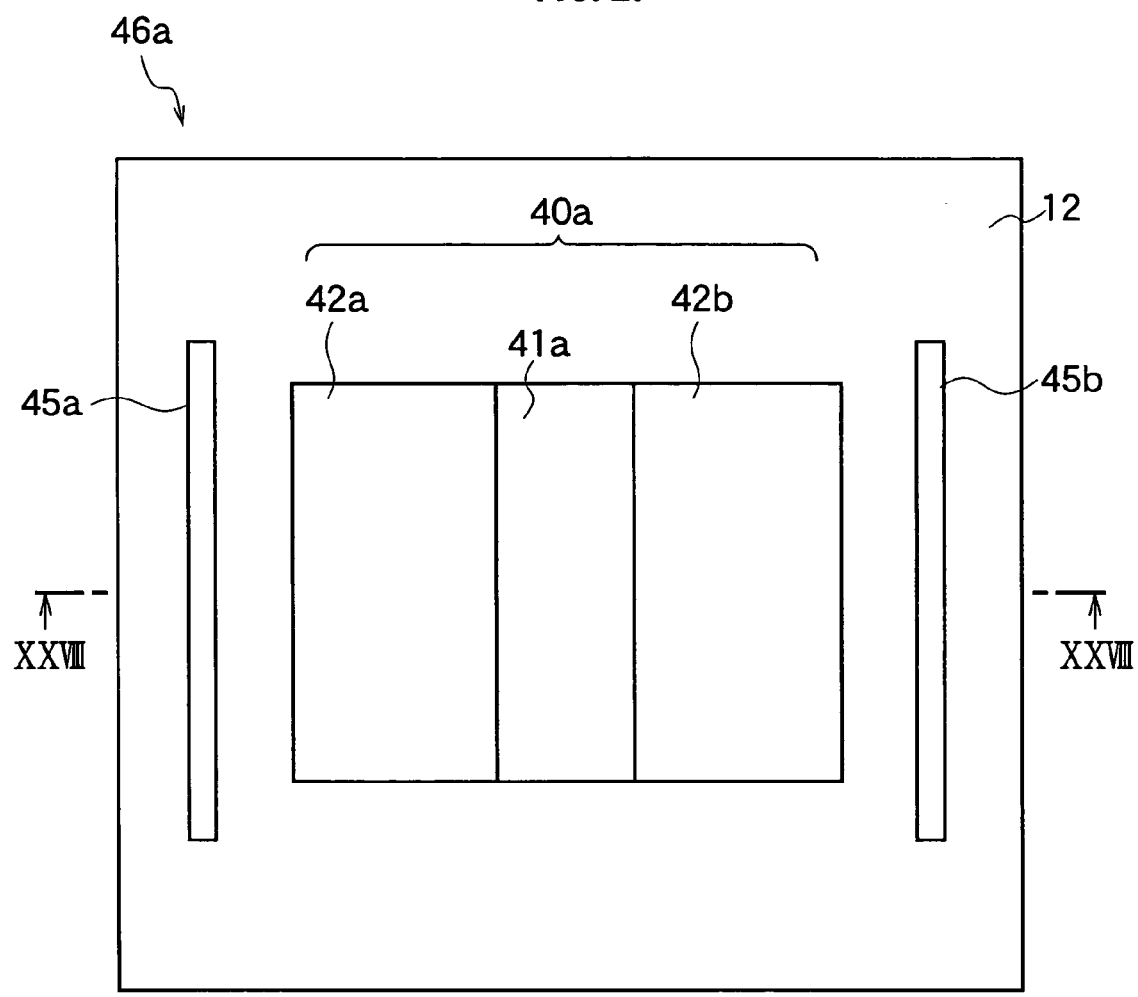
FIG. 27 is a plan view illustrating another example of the exposure dose monitor mark according to the second modification of the embodiment of the present invention.
Figure 28:
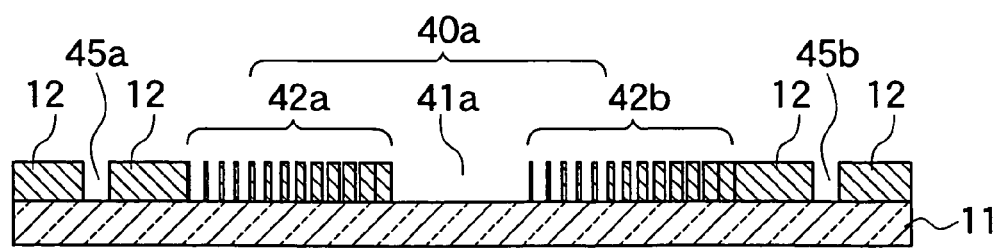
FIG. 28 is a cross-sectional view of the exposure dose monitor mark taken along line XXVIII-XXVIII in FIG. 27 according to the second modification of the embodiment of the present invention.

In the exposure dose monitor mark 46 used in the above explanation, one diffraction grating 42 is provided in the exposure dose monitor pattern 40. In the second modification of the embodiment, a number of diffraction grating is not limited to one. As another example, first and second diffraction gratings 42a and 42b are provided at both left and right ends of an opening 41a in an exposure dose monitor mark 46a, as shown in FIG. 27. As shown in FIG. 28, the first and second diffraction gratings 42a and 42b of the exposure dose monitor mark 46a are L/S patterns in which an opening ratio is varied step-by-step from approximately 100% to 0% in the same direction from the left end. The L/S patterns are arranged at a constant pitch less than a resolution limit represented by the expression (1).

Figure 29:
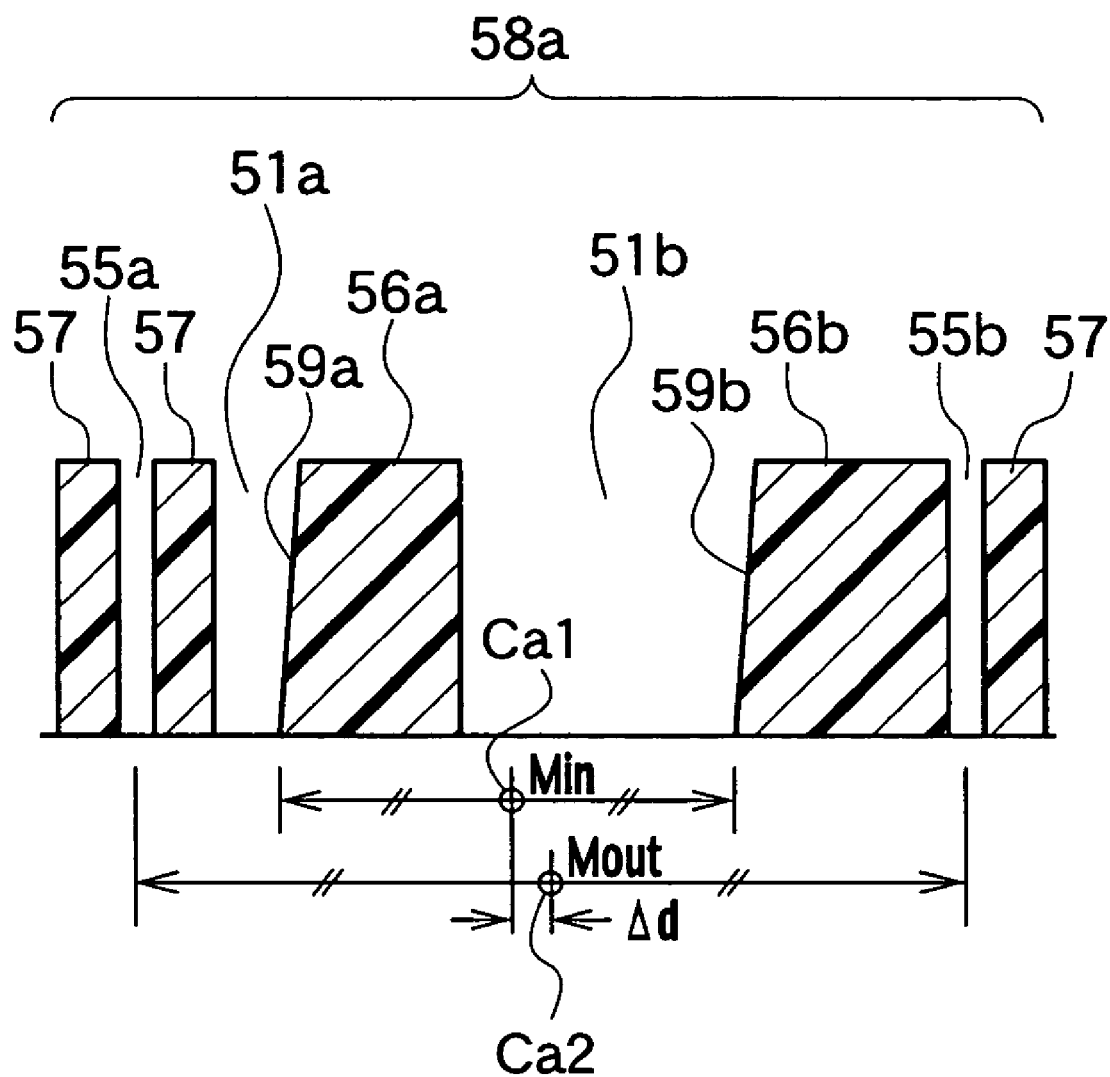
FIG. 29 is a cross-sectional view illustrating another example of a transferred image of the resist monitor pattern according to the second modification of the embodiment of the present invention.

In a resist monitor pattern 58a delineated on a resist film 57 by transferring the exposure dose monitor mark 46a by the exposure tool, as shown in FIG. 29, position detection resist openings 55a, 55b are formed in the resist film 57 so as to correspond to the position detection patterns 45a and 45b. A first resist opening 51a is formed at a position corresponding to a left end portion of the first diffraction grating 42a and a first transferred image 56a having an inclined sidewall 59a is formed at a position corresponding to a right end portion of the first diffraction grating 42a. Furthermore, a second resist opening 51b and a second transferred image 56a having an inclined sidewall 59b are respectively formed at positions corresponding to the opening 41a and second diffraction grating 42b. Here, a center of a width Min between tangent edges to an underlying layer of the inclined sidewalls 59a, 59b of the first and second transferred images 56a, 56b is Ca1, and a center of a width Mout between the position detection resist openings 55a and 55b is Ca2. The amount of relative displacement Δd between the center positions Ca1, Ca2 is increased to approximately two times the amount of relative displacement Δd determined when using the exposure dose monitor mark 46, because edge positions of the inclined sidewalls 59a and 59b of the first and second transferred images 56a and 56b delineated by the first and second diffraction gratings 42a and 42b are displaced in the same direction. Therefore, it is possible to increase measurement sensitivity for the relative displacement Δd. Accordingly, sensitivity of an inspection target photoresist can be highly accurately evaluated.

Figure 30:
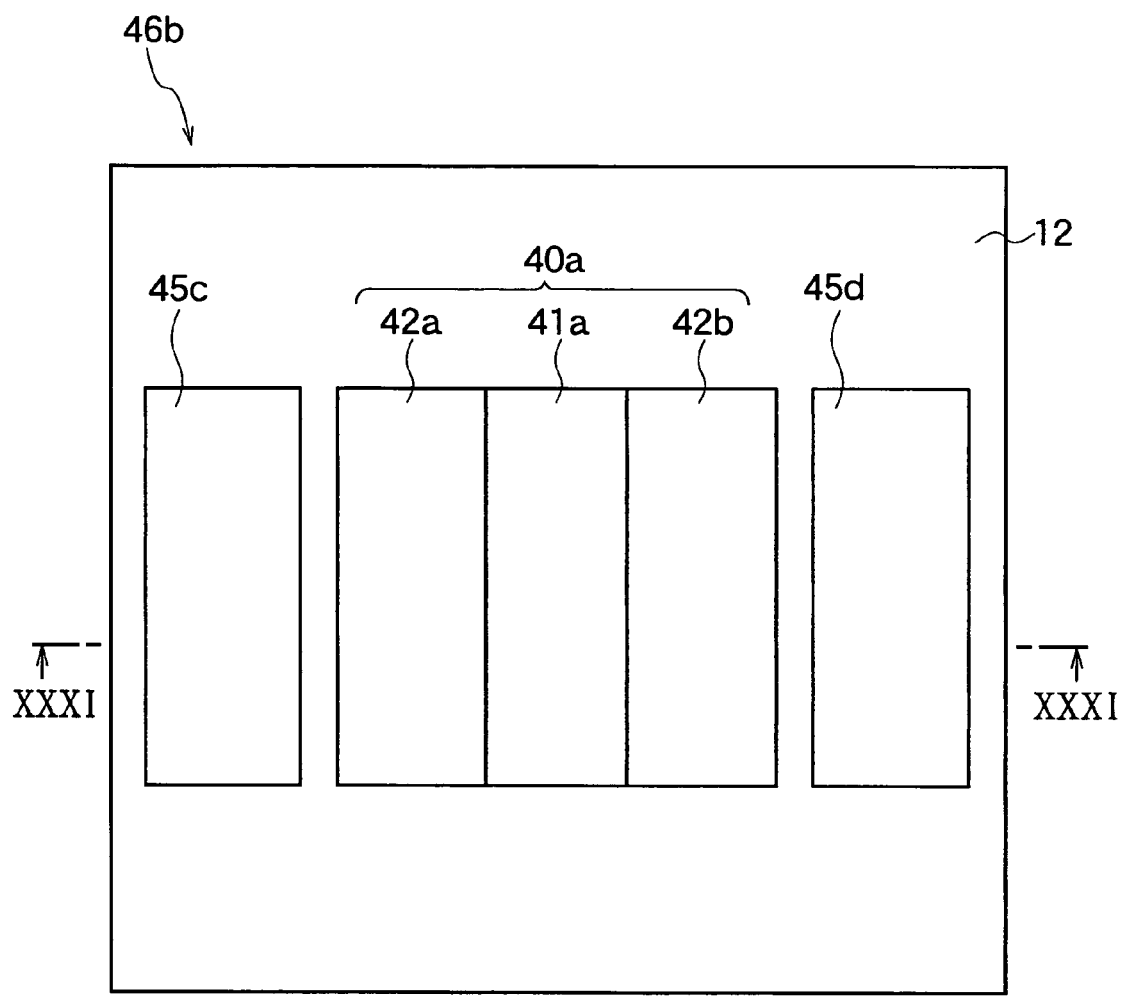
FIG. 30 is a plan view illustrating yet another example of the exposure dose monitor mark according to the second modification of the embodiment of the present invention.
Figure 31:
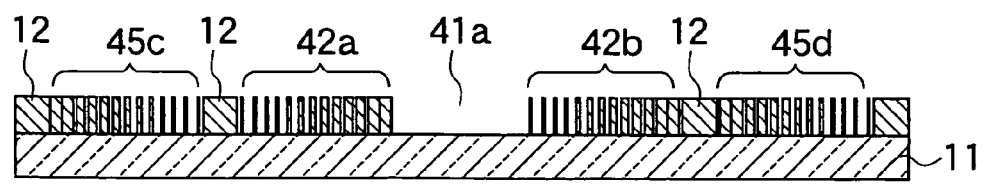
FIG. 31 is a cross-sectional view of the exposure dose monitor mark taken along line XXXI-XXXI in FIG. 30 according to the second modification of the embodiment of the present invention.

Moreover, in the exposure dose monitor mark 46a shown in FIG. 27, the L/S patterns in which the opening ratio of the first and second diffraction gratings 42a and 42b is varied step-by-step in the same direction is used. However, in an exposure dose monitor mark 46b, as shown in FIG. 30 and 31, L/S patterns in which an opening ratio is varied step-by-step in the same direction is also provided in position detection patterns 45c and 45d. In this case, a direction of variation in the opening ratio of the L/S pattern for the position detection patterns 45c and 45d is opposite to a direction of variation in the opening ratio of the L/S pattern for the first and second diffraction gratings 42a and 42b. As a result, since a center of a width between the position detection resist patterns to be delineated is displaced in an opposite direction in relation to displacement of a center of a width between the edges of the first and second inclined sidewalls, a further increase in the amount of relative displacement Δd can be provided. Accordingly, sensitivity of an inspection target photoresist may be evaluated with higher accuracy.

OTHER EMBODIMENTS

Figure 32:
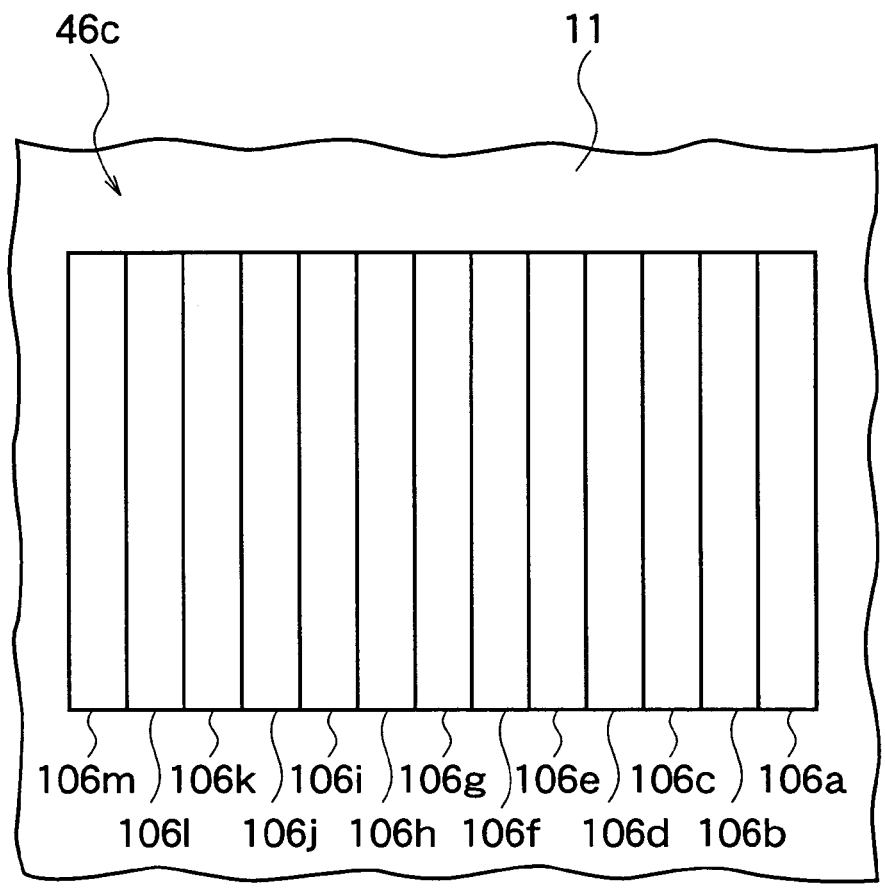
FIG. 32 is a plan view illustrating an example of an exposure dose monitor mark according to other embodiments of the present invention.
Figure 33:
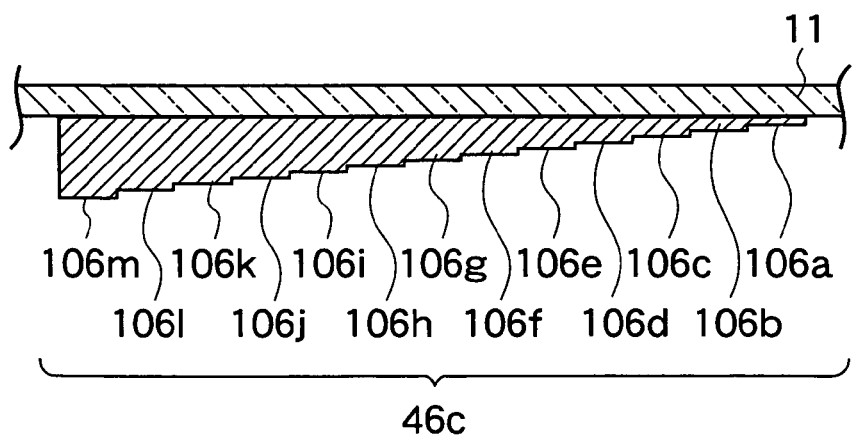
FIG. 33 is a cross-sectional view of the exposure dose monitor mark shown in FIG. 32 according to other embodiments of the present invention.

In the embodiment, an exposure mask pattern in which the opening ratio of diffraction grating is varied in a desired ratio to provide a transmittance distribution of exposure light is used. However, the exposure mask pattern is not limited to the diffraction grating, but may be provided by any other method which produces a transmittance distribution of exposure light. For example, as shown in FIG. 32 and 33, as an exposure dose monitor pattern 46c, a plurality of opaque films 106a to 106m having a constant width are arranged on a transparent substrate 11 so as to vary a film thickness with a constant ratio. Even when a metal is used as a thin film, transparency is possible. Therefore, when thin metal films, used as the opaque films 106a to 106m, are deposited with a thickness distribution, light transmittance may be variable. Each film thickness of the opaque films 106a to 106m is increased step-by-step in a direction from the opaque film 106a to opaque film 106m. Accordingly, the transmittance of the opaque film 106a on the right end is a maximum of nearly 100% and the transmittance of the opaque film 106m is almost 0%. As such, a structure in which each film thickness of opaque films 106a to 106m is varied step-by-step can be applied to exposure dose monitoring explained in the description of the first and second modifications of the embodiment. Furthermore, a structure in which a film thickness of an opaque film is varied sequentially in a constant direction can also be applied to exposure dose monitoring. Moreover, even a structure using a grainy opaque material in which grain density varies so as to vary light transmittance may provide similar effectiveness.

Additionally, in the embodiment of the invention, although a KrF excimer laser reduction projection exposure tool is used for simplification of explanation, an ultraviolet ray such as i-line and g-line, other excimer lasers such as an argon fluoride (ArF) laser and a fluorine ($F_2$) laser may also be used as a light source, or an electron beam, an X-ray beam and the like may also be used as a light source. Furthermore, a contact printer, a proximity printer, or a mirror projection printer may be used as an exposure tool.

Various modifications will become possible for those skilled in the art after storing the teachings of the present disclosure without departing from the scope thereof.

What is claimed is:

1. A method for evaluating sensitivity of a photoresist, comprising:
    transferring an exposure dose monitor mark onto a reference resist film with a reference setting exposure dose using an exposure tool;
    measuring a reference sensitivity index varying according to the reference setting exposure dose, using a reference transferred image of the exposure dose monitor mark delineated on the reference resist film;
    obtaining a relationship between the reference setting exposure dose and the reference sensitivity index as sensitivity calibration data;
    transferring the exposure dose monitor mark onto an inspection resist film with an inspection setting exposure dose using the exposure tool;
    measuring an inspection sensitivity index varying according to the inspection setting exposure dose, using an inspection transferred image of the exposure dose monitor mark delineated on the inspection resist film; and
    calculating an inspection photoresist sensitivity of the inspection resist film using the sensitivity calibration data, based on the inspection sensitivity index.

2. The method of claim 1, wherein the inspection transferred image and the reference transferred image are respectively transferred by a diffraction grating.

3. The method of claim 1, wherein the inspection transferred image and the reference transferred image are respectively transferred by a pattern having a stepped distribution of an opening ratio in a plane of the exposure dose monitor mark.

4. The method of claim 2, wherein the diffraction grating is a line and space pattern having a pitch less than a width determined by a wavelength of a light source of the exposure tool, a numerical aperture of a projection optical system of the exposure tool, and coherence factor of an illumination optical system of the exposure tool.

5. The method of claim 4, wherein the width is a value determined by dividing the wavelength by a sum of the coherence factor and one, and by the numerical aperture.

6. The method of claim 4, wherein the inspection transferred image and the reference transferred image are delineated by an exposure light of the exposure tool having a stepped intensity distribution in a plane of the exposure dose monitor mark.

7. The method of claim 6, wherein the inspection sensitivity index and the reference sensitivity index are one of a space width and a line width of a plurality of the line and space patterns, the line and space patterns having opening ratios different from one another.

8. The method of claim 1, wherein the inspection transferred image and the reference transferred image are delineated by an exposure light of the exposure tool having a stepped intensity distribution along a direction in a plane of the exposure dose monitor mark.

9. The method of claim 8, wherein the inspection sensitivity index and the reference sensitivity index are widths of the inspection transferred image and the reference transferred image.

10. The method of claim 9, wherein the inspection sensitivity index and the reference sensitivity index are amounts of relative displacements between position detection resist openings delineated by the exposure dose monitor mark, and one of the inspection transferred image and the reference transferred image.

11. The method of claim 1, wherein the inspection sensitivity index and the reference sensitivity index are measured by the inspection transferred image and the reference transferred image after a development process.

12. The method of claim 1, wherein the inspection sensitivity index and the reference sensitivity index are measured by the inspection transferred image and the reference transferred image after one of an exposure process and a post exposure bake process.

13. A method for preparation of a photoresist, comprising:
    transferring an exposure dose monitor mark onto a reference resist film with an reference selling exposure dose using an exposure tool;
    measuring a reference sensitivity index varying according to the reference selling exposure dose, using a reference transferred image of the exposure dose monitor mark delineated on the reference resist film;
    obtaining a relationship between the reference selling exposure dose and the reference sensitivity index as sensitivity calibration data;
    transferring the exposure dose monitor mark onto an inspection resist film with an inspection selling exposure dose, the inspection resist film coated by an inspection target photoresist;
    measuring an inspection sensitivity index varying according to the inspection setting exposure dose, using an inspection transferred image of the exposure dose monitor mark delineated on the inspection resist film;
    calculating an inspection photoresist sensitivity of the inspection resist film using the sensitivity calibration data, based on the inspection sensitivity index;
    calculating a sensitivity difference between the inspection selling exposure dose and the inspection photoresist sensitivity; and
    modifying the photoresist sensitivity of the inspection target photoresist based on the sensitivity difference.

14. The method of claim 13, further comprising:
    obtaining a relationship of a sensitivity variation of a sensitivity calibration photoresist with respect to a photoresist additive to the sensitivity calibration photoresist; and
    modifying the photoresist sensitivity of the inspection target photoresist based on the relationship of the sensitivity variation.

15. The method of claim 14, wherein the photoresist additive is a photosensitive agent and the photoresist sensitivity of the inspection target photoresist is modified by addition of the photosensitive agent.

16. The method of claim 14, wherein the photoresist additive is an acid trapping agent and the photoresist sensitivity of the inspection target photoresist is modified by addition of the acid trapping agent.

17. The method of claim 13, wherein the inspection transferred image and the reference transferred image are respectively transferred by a diffraction grating.

18. The method of claim 13, wherein the inspection transferred image and the reference transferred image are respectively transferred by a pattern having a stepped distribution of an opening ratio in a plane of the exposure dose monitor mark.

19. The method of claim 17, wherein the diffraction grating is a line and space pattern having a pitch less than a width determined by a wavelength of a light source of the exposure tool, a numerical aperture of a projection optical system of the exposure tool, and coherence factor of an illumination optical system of the exposure tool.

20. The method of claim 19, wherein the width is a value determined by dividing the wavelength by a sum of the coherence factor and one, and by the numerical aperture.

21. The method of claim 19, wherein the inspection transferred image and the reference transferred image are delineated by an exposure light of the exposure tool having a stepped intensity distribution in a plane of the exposure dose monitor mark.

22. The method of claim 21, wherein the inspection sensitivity index and the reference sensitivity index are one of a space width and a line width of a plurality of the line and space patterns, the line and space patterns having opening ratios different from one another.

23. The method of claim 13, wherein the inspection transferred image and the reference transferred image are delineated by an exposure light of the exposure tool having a stepped intensity distribution along a direction in a plane of the exposure dose monitor mark.

24. The method of claim 23, wherein the inspection sensitivity index and the reference sensitivity index are widths of the inspection transferred image and the reference transferred image.

25. The method of claim 24, wherein the inspection sensitivity index and the reference sensitivity index are amounts of relative displacements between position detection resist openings delineated by the exposure dose monitor mark, and one of the inspection transferred image and the reference transferred image.

26. The method of claim 13, wherein the inspection sensitivity index and the reference sensitivity index are measured by use of the inspection transferred image and the reference transferred image after a development process.

27. The method of claim 13, wherein the inspection sensitivity index and the reference sensitivity index are measured by use of the inspection transferred image and the reference transferred image after one of an exposure process and a post exposure bake process.

28. A manufacturing method of a semiconductor device, comprising:
    transferring an exposure dose monitor mark onto a reference resist film with an reference setting exposure dose;
    measuring a reference sensitivity index varying according to the reference setting exposure dose, using a reference transferred image of the exposure dose monitor mark delineated on the reference resist film;

obtaining a relationship between the reference setting exposure dose and the reference sensitivity index as sensitivity calibration data;

transferring the exposure dose monitor mark onto an inspection resist film with an inspection setting exposure dose, the inspection resist film being coated by an inspection target photoresist;

measuring an inspection sensitivity index varying according to the inspection setting exposure dose, using an inspection transferred image of the exposure dose monitor mark delineated on the inspection resist film;

calculating an inspection photoresist sensitivity of the inspection resist film using the sensitivity calibration data, based on the inspection sensitivity index;

calculating a sensitivity difference between the inspection setting exposure dose and the inspection photoresist sensitivity;

modifying the inspection target photoresist based on the sensitivity difference to prepare a manufacturing photoresist;

loading a semiconductor substrate coated with the manufacturing photoresist in an exposure tool; and transferring a circuit pattern of a photomask on the semiconductor substrate so as to manufacture a semiconductor device.

\* \* \* \* \*